United States Patent
Motwani et al.

(10) Patent No.: US 11,777,530 B2
(45) Date of Patent: Oct. 3, 2023

(54) METHODS AND APPARATUSES FOR GENERATING OPTIMIZED LDPC CODES

(71) Applicant: Intel Corporation, Santa Clara, CA (US)

(72) Inventors: Ravi Motwani, Fremont, CA (US); Poovaiah Palangappa, San Jose, CA (US); Santosh Emmadi, Santa Clara, CA (US); Santhosh K. Vanaparthy, Santa Clara, CA (US); Aman Bhatia, Los Gatos, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/754,152

(22) PCT Filed: Nov. 5, 2020

(86) PCT No.: PCT/US2020/059164
§ 371 (c)(1),
(2) Date: Mar. 25, 2022

(87) PCT Pub. No.: WO2021/096757
PCT Pub. Date: May 20, 2021

(65) Prior Publication Data
US 2022/0294474 A1 Sep. 15, 2022

Related U.S. Application Data

(60) Provisional application No. 62/935,834, filed on Nov. 15, 2019, provisional application No. 62/935,814, (Continued)

(51) Int. Cl.
*H03M 13/35* (2006.01)
*H03M 13/03* (2006.01)
(Continued)

(52) U.S. Cl.
CPC ....... *H03M 13/353* (2013.01); *H03M 13/036* (2013.01); *H03M 13/612* (2013.01); *H03M 13/1162* (2013.01); *H03M 13/2948* (2013.01)

(58) Field of Classification Search
CPC . H03M 13/353; H03M 13/612; H03M 13/036
See application file for complete search history.

(56) References Cited

U.S. PATENT DOCUMENTS

2011/0276860 A1 11/2011 Lei et al.
2013/0266078 A1* 10/2013 Deligiannis .......... H04N 19/152
375/240.25
(Continued)

FOREIGN PATENT DOCUMENTS

KR 1020150004786 A 1/2015

OTHER PUBLICATIONS

Franceschini et al. (Michele Franceschini, Gianluigi Ferrari, Riccardo Raheli; LDPC Coded Modulations; Springer-Verlag, Berlin Heidelberg, 2009) (Year: 2009).*
(Continued)

*Primary Examiner* — Joseph D Torres
(74) *Attorney, Agent, or Firm* — 2SPL Patentanwälte PartG mbB; Yong Beom Hwang

(57) ABSTRACT

Methods and apparatuses for generating optimized LDPC codes are proposed. One of the methods is a method for generating an optimized LDPC code for an asymmetric transmission channel. The method includes receiving an initial LDPC code for the asymmetric transmission channel. Further, the method includes performing a density evolution threshold optimization for the initial LDPC code in order to obtain the optimized LDPC code for the asymmetric transmission channel. A uniformly mixed symmetric channel density for the asymmetric transmission channel is used in the density evolution threshold optimization.

19 Claims, 9 Drawing Sheets

Related U.S. Application Data filed on Nov. 15, 2019, provisional application No. 62/935,254, filed on Nov. 14, 2019.

(51) Int. Cl.
*H03M 13/00* (2006.01)
*H03M 13/11* (2006.01)
*H03M 13/29* (2006.01)

(56) References Cited

U.S. PATENT DOCUMENTS

2015/0052413 A1* 2/2015 Eleftheriou ........ H03M 13/1105 714/758
2019/0140660 A1 5/2019 Palangappa et al.

OTHER PUBLICATIONS

Wang et al. (Chih-Chun Wang, Sanjeev R. Kulkarni, and H. Vincent Poor; Density Evolution for Asymmetric Memoryless Channels; IEEE Transactions on Information Theory, vol. 51, No. 12, Dec. 2005) (Year: 2005).*

Chih-Chun Wang et al. "Density Evoluton for Asymmetric Memoryless Channels"; IEEE Transactions On Information Theory, vol. 51, No. 8, Aug. 2005, pp. 4216-4236.

Tom Richardson: "Error Floors of LDPC Codes", pp. 1426-1435, In Proceedings of the annual Allerton conference on communication control and computing, vol. 41, No. 3, The University, 2003, pp. 1426-1435.

Lara Dolecek et al.: "Analysis of Absorbing Sets and Fully Absorbing Sets of Array-Based LDPC Codes", IEEE Transactions On Information Theory, vol. 56, No. 1, Jan. 2010, pp. 181-201.

Xiao-Yu Hu et al.: "Regular and Irregular Progressive Edge-Growth Tanner Graphs", IEEE Transactions on Information Theory; vol. 51, No. 1, Jan. 2005, pp. 386-397.

Hua Xiao et al.: "Improved Progressive-Edge-Growth (PEG) Construction of Irregular LDPC Codes", IEEE Communications Letters, vol. 8, No. 12, Dec. 2004, pp. 715-717.

Dejan Vukobratovic et al.: "Generalized ACE Constrained Progressive Edge-Growth LDPC Code Design", IEEE Communications Letters, vol. 12, No. 1, Januar 2008, pp. 32-34.

MARC p. C. Fossorier: "Quasi-Cyclic Low-Density Parity-Check Codes From Circulant Permutation Matrices", IEEE Transactions On Information Theory, vol. 50, No. 8, Aug. 2004, pp. 1788-1793.

Jun Fan et al.: "Design LDPC Codes without Cycles of Length 4 and 6", Hindawi Publishing Corporation, Research Letters in Communications vol. 2008, Article ID 354137, doi:10.1155/2008/342137, pp. 1-5.

Mehdi Karimi et al.: "Efficient Algorithm for Finding Dominant Trapping Sets of LDPC Codes", IEEE Transations On Information Theory, vol. 58, No. 11, Nov. 2012, pp. 6942-6958.

Michael G. Luby et al.: "Analysis of Low Density Codes and Improved Designs Using Irregular Graphs" in Proc. 30th Annu. ACM Symp. Theory of Computing, 1998, pp. 249-258.

Thomas J. Richardson et al.: "Design of Capacity-Approaching Irregular Low-Density Parity-Check Codes", IEEE Transactions on Information Theory; vol. 47, No. 2, Feb. 2001, pp. 619-637.

Sae-Young Chung et al.: "On the Design of Low-Density Parity-Check Codes within 0.0045 dB of the Shannon Limit", IEEE Communications Letters, vol. 5, No. 2, Feb. 2001, pp. 58-60.

* cited by examiner

| CW4+ Optimization | 4-Cycles | 6-Cycles | 8-Cycles | 10-Cycles |
|---|---|---|---|---|
| >=CW4 | 1 | 2 | 3 | 4 |

1200

| CW3 Optimization | 4-Cycles | 6-Cycles | 8-Cycles | 10-Cycles |
|---|---|---|---|---|
| CW3 | - | 2 | 3 | 4 |
| >=CW4 | 1 | X | X | X |

| CW2 Optimization | 4-Cycles | 6-Cycles | 8-Cycles | 10-Cycles |
|---|---|---|---|---|
| CW2-CW3 | - | 2 | 5 | 7 |
| CW2-CWX | 1 | 4 | 8 | X |
| CW3 | - | 3 | 6 | X |
| >=CW4 | 1 | X | X | X |

METHODS AND APPARATUSES FOR GENERATING OPTIMIZED LDPC CODES

FIELD

The present disclosure relates to Low-Density Parity-Check (LDPC) code optimization. In particular, examples relate to methods and apparatuses for generating optimized LDPC codes.

BACKGROUND

LDPC codes are a widely used error-correction mechanism in today's communication and storage systems. Given the characteristics of the channel, the column- and row-degree distribution of the codes can be optimized such that the LDPC code can perform very close to the Shannon limit.

However, such carefully designed LDPC codes are not universal. For example, an LDPC code designed for one particular channel may not work well for other channels. Furthermore, the design of LDPC codes is well-studied when the underlying channels are symmetric, i.e., when the error transition probabilities do not depend on the transmitted symbol. However, the channels typically encountered in practical communication and storage systems are asymmetric and can sometimes be severely skewed. There are no clear design principles for LDPC codes in such scenarios.

Often LDPC codes suffer from what is known as "error floor" where the slope of the output error-rate curve in the low input error-rate regime degrades significantly in comparison to the high input error-rate regime. For applications that require high reliability, this may limit the use of LDPC codes.

Hence, there may be a desire for LDPC code optimization techniques.

BRIEF DESCRIPTION OF THE FIGURES

Some examples of apparatuses and/or methods will be described in the following by way of example only, and with reference to the accompanying figures, in which

FIG. 13 illustrates a second example of an optimization order;

FIG. 14 illustrates a third example of an optimization order;

DETAILED DESCRIPTION

Figure 1:
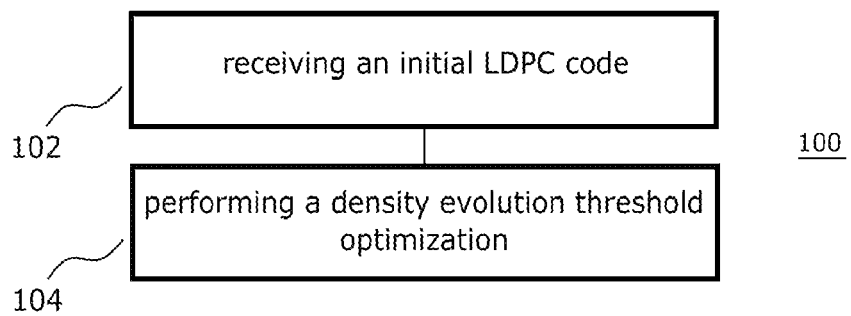
FIG. 1 illustrates a flowchart of an example of a method for generating an optimized LDPC code for an asymmetric transmission channel.

Some examples are now described in more detail with reference to the enclosed figures. However, other possible examples are not limited to the features of these embodiments described in detail. Other examples may include modifications of the features as well as equivalents and alternatives to the features. Furthermore, the terminology used herein to describe certain examples should not be restrictive of further possible examples.

Throughout the description of the figures same or similar reference numerals refer to same or similar elements and/or features, which may be identical or implemented in a modified form while providing the same or a similar function. The thickness of lines, layers and/or areas in the figures may also be exaggerated for clarification.

When two elements A and B are combined using an "or", this is to be understood as disclosing all possible combinations, i.e. only A, only B as well as A and B, unless expressly defined otherwise in the individual case. As an alternative wording for the same combinations, "at least one of A and B" or "A and/or B" may be used. This applies equivalently to combinations of more than two elements.

If a singular form, such as "a", "an" and "the" is used and the use of only a single element is not defined as mandatory either explicitly or implicitly, further examples may also use several elements to implement the same function. If a function is described below as implemented using multiple elements, further examples may implement the same function using a single element or a single processing entity. It is further understood that the terms "include", "including", "comprise" and/or "comprising", when used, describe the presence of the specified features, integers, steps, operations, processes, elements, components and/or a group thereof, but do not exclude the presence or addition of one or more other features, integers, steps, operations, processes, elements, components and/or a group thereof.

LDPC codes are a ubiquitously used error-correction mechanism in modern communication systems. They are characterized by a parity-check matrix with sparse column and row weights (with respect to the overall dimension). LDPC codes are often represented by a Tanner graph connecting columns (variable-nodes) and rows (check-nodes).

Figure 2:
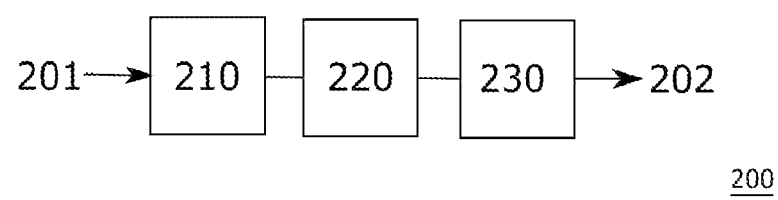
FIG. 2 illustrates an example of an apparatus for generating an optimized LDPC code for an asymmetric transmission channel.

FIG. 1 illustrates a flowchart of an example of a method 100 for generating an optimized LDPC code for an asymmetric transmission channel. The method 100 will be described in the following further with reference to FIG. 2 which illustrates an exemplary apparatus 200 for generating an optimized LDPC code for an asymmetric transmission channel.

An asymmetric transmission channel is a transmission channel where the output transition probabilities are different for the different possible input values of the transmission channel. For example, for a binary input asymmetric transmission channel, the output transition probabilities for input bits 0 and 1 are different.

The method 100 comprises receiving 102 an initial LDPC code for the asymmetric transmission channel. Accordingly, the apparatus 200 comprises input circuitry 210 configured to receive the initial LDPC code 201. The initial LDPC code is the LDPC code to be optimized for the asymmetric transmission channel. In other words, the initial LDPC code serves as basis for the following code optimization process.

The method 100 additionally comprises performing 104 a Density Evolution (DE) threshold optimization for the initial LDPC code in order to obtain the optimized LDPC code for the asymmetric transmission channel. The apparatus 200 comprises a corresponding processing circuitry 220 for performing the DE threshold optimization for the initial LDPC code. For example, the processing circuitry 220 may be a single dedicated processor, a single shared processor, or a plurality of individual processors, some of which or all of which may be shared, a digital signal processor (DSP) hardware, an application specific integrated circuit (ASIC) or a field programmable gate array (FPGA). The processing circuitry 220 may optionally be coupled to, e.g., read only memory (ROM) for storing software, random access memory (RAM) and/or non-volatile memory. The optimized LDPC code 202 as determined by the processing circuitry 220 is output by output circuitry 230 of the apparatus 200.

DE is a numerical tool to analyze message-passing decoding algorithms for LDPC codes. By emulating the variable-node and check-node operations of the message-passing decoder, the DE computes the distribution of messages during decoding for asymptotically large LDPC codes. This message distribution is then used to predict the output bit-error rate (as a function of the channel parameter) at the end of the decoding. Due to the asymptotic nature of the elements involved in the DE computation, below a certain "threshold" of the channel parameter, the output bit-error rate computed by DE will be equal to zero. While it may appear that this computation is of purely theoretical interest, the threshold corresponds to the "knee point" or the "onset of the waterfall" of the output error-rate curves even for practical finite-length codes such as the initial LDPC code that is to be optimized. Computing the threshold with DE and optimizing this knee point is a fundamental method employed to design practical LDPC codes for communication and storage systems. The DE threshold optimization involves (comprises) a functional optimization of column- and row-degree distributions using techniques such as hill climbing, simulated annealing, etc.

In its conventional setting for symmetric transmission channels, the DE computes the edge message distribution by making an all-zero codeword assumption at the decoder. This is because for symmetric transmission channels and linear codes (LDPC codes are linear), the output error probability at the decoder is independent of the codeword transmitted, and one can assume that all-zero codeword was transmitted without loss of generality. In sharp contrast, for asymmetric transmission channels, this assumption is not valid and the output error probability at the decoder strictly depends on the transmitted codeword. Thus, asymmetric transmission channels are complicated and are much less amenable to analysis than symmetric channels.

In order to account for the structure of the asymmetric transmission channel, a uniformly mixed symmetric channel density for the asymmetric transmission channel is used in the DE threshold optimization. The uniformly mixed symmetric channel density is a combination of uniformly weighted channel densities for the asymmetric transmission channel for each possible input value of the asymmetric transmission channel.

The optimization approach of the method 100 is based on the finding that not all codewords of the LDPC code are of interest for practical asymmetric transmission channel. Due to encoding and decoding latency constraints, all practical system implementations of an LDPC code use systematic encoding, which means the transmitted codeword contains distinguishable data and parity portions. Moreover, due to the security constraints the data likely has been encrypted before the encoder, which means the data portion of the codeword contains uniform ones and zeros (i.e., close to 50% 0's and 50% 1's). Even without encryption, the fact that the user data are usually uniformly random 0's and 1's as a stream (especially after compression) also lends credence to the uniformity assumption. Now, since the data contain uniform 0's and 1's, this also implies that the parity portion of the codeword contains uniform 0's and 1's, and thus the overall codeword contains uniform zeros and ones (i.e., close to 50% 0's and 1's). That is, in practice, the LDPC codeword contains uniform zeros and ones. However, the overall LDPC codebook contains codewords that have a wide range of fractions of zeros and ones between 0 and 1.

By leveraging the uniformity of zeros and ones in terms of the uniformly mixed symmetric channel density for the asymmetric transmission channel, the method 100 involves an approximation to the asymmetric transmission channel, and reduces the problem of dealing with an asymmetric transmission channel into the domain of symmetric transmission channels. This transformation of problems further allows to use all existing techniques on symmetric transmission channels.

For example, for a binary symmetric transmission channel with crossover probability (error transition probability) p, the channel Log-Likelihood Ratio (LLR) density c for the purpose of DE may be given by:

$$c(x; p) = p\Delta\left(x - \log\frac{p}{1-p}\right) + (1-p)\Delta\left(x - \log\frac{1-p}{p}\right) \quad (1)$$

with x denoting a value input to the binary symmetric transmission channel and $\Delta$ denoting the Dirac delta function with a probability mass of "1" at value x=0.

Considering a two-input binary asymmetric transmission channel, the crossover probability (error transition probability) for the bit value 0 is p and the crossover probability (error transition probability) for the bit value 1 is q. For example, the transition probabilities Pr when the bit value 0 is transmitted may be:

$$Pr(Y=1|X=0)=p \quad (2)$$

and $$Pr(Y=0|X=0)=1-p \quad (3)$$

with X denoting a value input to the binary asymmetric transmission channel and Y denoting the value output by the binary asymmetric transmission channel.

Similarly, the transition probabilities Pr when the bit value 1 is transmitted may be:

$$Pr(Y=1|X=1)=1-q \qquad (4)$$

and $$Pr(Y=0|X=1)=q \qquad (5)$$

Therefore, for a two-input binary asymmetric transmission channel, there are two channel densities $c_0$ and $c_1$ for the two possible input values in play:

$$c_0(x;p) = p\Delta\left(x - \log\frac{p}{1-p}\right) + (1-p)\Delta\left(x - \log\frac{1-p}{p}\right) \qquad (6)$$

$$c_1(x;q) = (1-q)\Delta\left(x - \log\frac{q}{1-q}\right) + q\Delta\left(x - \log\frac{1-q}{q}\right) \qquad (7)$$

The channel density $c_0$ denotes the channel density of the asymmetric transmission channel for the possible input value 0, whereas the channel density $c_1$ denotes the channel density of the asymmetric transmission channel for the possible input value 1. In other words, for each possible input value of the asymmetric transmission channel, the respective channel density of the asymmetric transmission channel is based on a respective error transition probability of the asymmetric transmission channel for the respective possible input value.

Due to the assumption that the codewords of the LDPC in practice have uniform zeros and ones, the channel densities $c_0$ and $c_1$ may be combined to the uniformly mixed symmetric channel density as follows:

$$c(x;p,q)=\tfrac{1}{2}c_0(x;p)+\tfrac{1}{2}c_1(-x;q) \qquad (8)$$

The channel densities are combined to flip the sign for the bit value 1. That is, for a two-input binary asymmetric transmission channels, the uniformly mixed symmetric channel density is given by $$c(x;p,q) = \qquad (9)$$
$$\tfrac{1}{2}p\Delta\left(x - \log\frac{p}{1-p}\right) + \tfrac{1}{2}q\Delta\left(x - \log\frac{q}{1-q}\right) + \tfrac{1}{2}(1-p)\Delta\left(x - \log\frac{1-p}{p}\right) +$$
$$\tfrac{1}{2}(1-q)\Delta\left(x - \log\frac{1-q}{q}\right)$$

The uniformly mixed symmetric channel density $c(x; p, q)$ allows to perform the DE and obtain the output bit-error rate such that the DE evolution threshold and, hence, the LDPC code may be optimized.

This approach may be generalized for arbitrary asymmetric transmission channels with channel densities $c_0$ and $c_1$ for the two possible input value of the asymmetric transmission channel:

$$c(x)=\tfrac{1}{2}\cdot c_0(x)+\tfrac{1}{2}\cdot c_1(-x) \qquad (10)$$

with c(x) denoting the uniformly mixed symmetric channel density for the asymmetric transmission channel.

In other words, if the number of possible input values is two, the uniformly mixed symmetric channel density is a sum of a channel density of the asymmetric transmission channel for one of the two possible input values and a channel density of the asymmetric transmission channel for the other of the two possible input values. The channel densities of the asymmetric transmission channel for the two possible input values are both weighted with a weighting factor of 0.5 in the uniformly mixed symmetric channel density of the asymmetric transmission channel.

The uniformly mixed symmetric channel density is used in the DE to determine the output error-rate, which itself is used for the degree distribution optimization of the LDPC code similar to what is known for symmetric transmission channels.

For example, performing the DE threshold optimization for the initial LDPC code may, in a first iteration, comprise modifying at least one of a column degree distribution and a row degree distribution of the initial LDPC code in order to obtain a modified LDPC code of the first iteration. According to some example, both the column degree distribution and the row degree distribution of the initial LDPC code may be modified in order to obtain the modified LDPC code of the first iteration (hill climbing or simulated annealing may be used for the modification of the initial LDPC code). Subsequently, performing the DE threshold optimization for the initial LDPC code may, in the first iteration, comprise determining the DE threshold for the modified LDPC code of the first iteration using the uniformly mixed symmetric channel density. If the DE threshold for the modified LDPC code of the first iteration satisfies a quality criterion, the modified LDPC code of the first iteration may be selected as the optimized LDPC code in the first iteration. Else, the initial LDPC code may be selected as the optimized LDPC code in the first iteration.

For subsequent i-th iterations with $1<i$ (i being an integer), performing the DE threshold optimization for the initial LDPC code may comprise modifying at least one of the column degree distribution and the row degree distribution of the optimized LDPC code in order to obtain a modified LDPC code of the i-th iteration. Further, performing the DE threshold optimization for the initial LDPC code may, in the i-th iteration, comprise determining the DE threshold for the modified LDPC code of the i-th iteration using the uniformly mixed symmetric channel density. If the DE threshold for the modified LDPC code of the i-th iteration satisfies the quality criterion, the modified LDPC code of the i-th iteration may be selected as the optimized LDPC code. Else, the current optimum (optimized) LDPC code is maintained.

The performance of an LDPC code optimized according to the method 100 will be highlighted in the following with reference to FIGS. 3 and 4. In particular, the following variable-node distribution $L_{sym}$ (x) obtained by DE threshold optimization for a symmetric Additive White Gaussian Noise (AWGN) channel is assumed as a reference:

$$L_{sym}(x)=262x^3+x^6+16x^8+6x^{10}+2x^{11}+4x^{12}+x^{12}+x^{14}+ 2x^{15}+2x^{16}+x^{19}+x^{20}+x^{34} \qquad (11)$$

Further, the following variable-node distribution $L_{asy}(x)$ obtained by DE threshold optimization for an asymmetric Not-AND (NAND) transmission channel according to the method 100 is assumed:

$$L_{asy}(x)=270x^3+5x^{10}+10x^{11}+6x^{12}+5x^{13}+4x^{14} \qquad (12)$$

The resulting degree distributions from DE threshold optimization have unique characteristics for symmetric and asymmetric channels.

Figure 3:
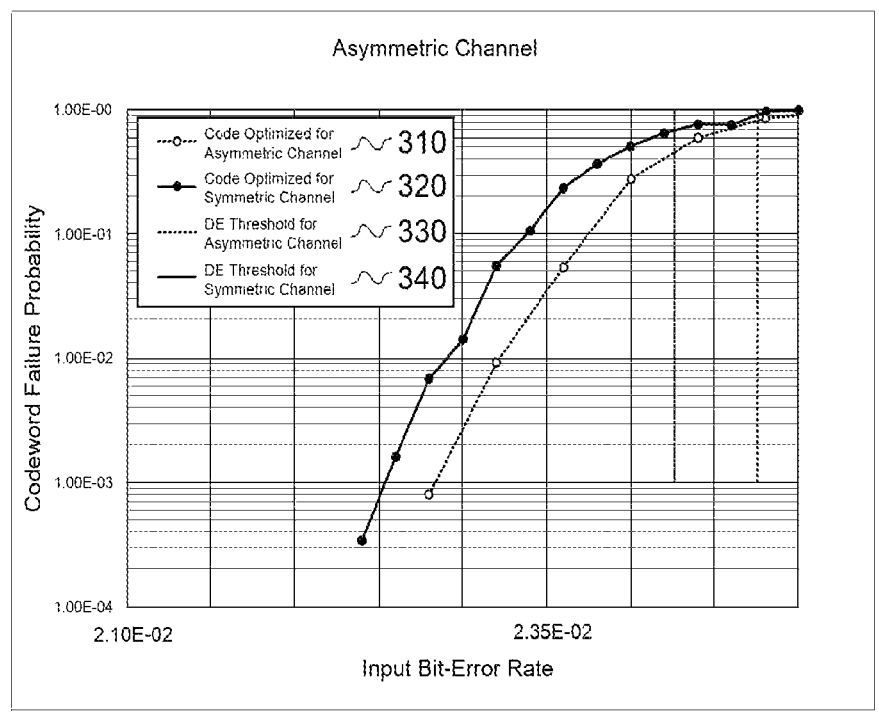
FIG. 3 illustrates a first exemplary performance comparison between an optimized LDPC code for an asymmetric transmission channel and an optimized LDPC code for a symmetric transmission channel when the underlying transmission channel is asymmetric.

FIG. 3 illustrates an exemplary comparison of output Bit Error Rate (BER) courses over input BER for an asymmetric transmission channel. In particular, line 310 illustrates the course of the output BER for the LDPC code optimized for the asymmetric transmission channel according to the method 100. Line 320 illustrates the course of the output BER for the LDPC code optimized for the symmetric transmission channel. As a reference, the DE evolution threshold 330 for the asymmetric NAND transmission channel and the DE evolution threshold 340 for the symmetric AWGN channel are illustrated in FIG. 3.

As can be seen from FIG. 3, the LDPC code optimized for symmetric AWGN transmission channels performs worse on the asymmetric NAND transmission channel compared to the LDPC code optimized specifically for the asymmetric NAND transmission channel according to the method 100. This is also reflected in the gap to capacity, where variable-node distribution $L_{sym}(x)$ has smaller gap to capacity on the NAND channel compared to the variable-node distribution $L_{asy}(x)$.

Figure 4:
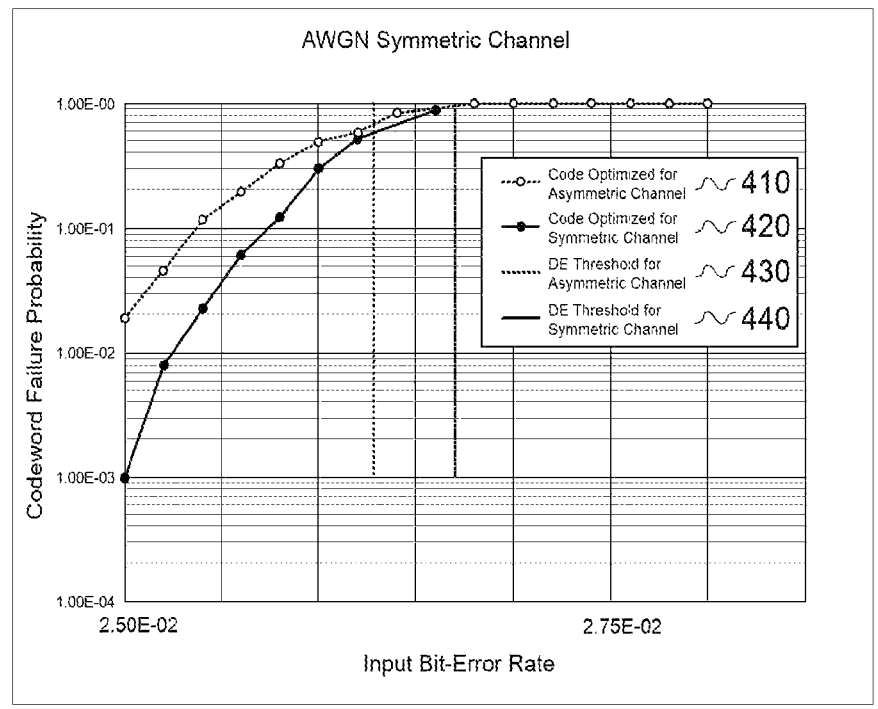
FIG. 4 illustrates a second exemplary performance comparison between an optimized LDPC code for an asymmetric transmission channel and an optimized LDPC code for a symmetric transmission channel when the underlying transmission channel is symmetric.

On the other hand, FIG. 4 illustrates an exemplary comparison of output BER courses over input BER for a symmetric transmission channel. In particular, line 410 illustrates the course of the output BER for the for the LDPC code optimized for the asymmetric transmission channel according to the method 100. Line 420 illustrates the course of the output BER for the for the LDPC code optimized for the symmetric transmission channel. As a reference, the DE evolution threshold 430 for the asymmetric NAND transmission channel and the DE evolution threshold 440 for the symmetric AWGN channel are illustrated in FIG. 4.

As can be seen from FIG. 4, the LDPC code optimized for symmetric AWGN transmission channels performs better on the symmetric AWGN transmission channel compared to the LDPC code optimized specifically for the asymmetric NAND transmission channel according to the method 100.

The method 100 is a mechanism that is simple to implement and results in good LDPC codes for asymmetric transmission channels. By leveraging the fact that in practical systems, the codewords of an LDPC code typically have uniform zeros and ones (i.e., 50% 0's and 50% 1's), the method 100 involves an approximation to the DE that works very well for asymmetric transmission channels seen in practice. The proposed technique allows to design superior LDPC codes with higher correction strength for asymmetric transmission channels.

The proposed technique may facilitate error-correction schemes based on LDPC codes with superior correctability, which may ultimately help deliver cheaper and better products to the customer. Rather than see asymmetry as a disadvantage, the proposed technique may leverage this to an advantage and design error-correcting codes that support high input error-rate mitigation, which directly translates to cost reduction and quicker time to market.

Figure 5:
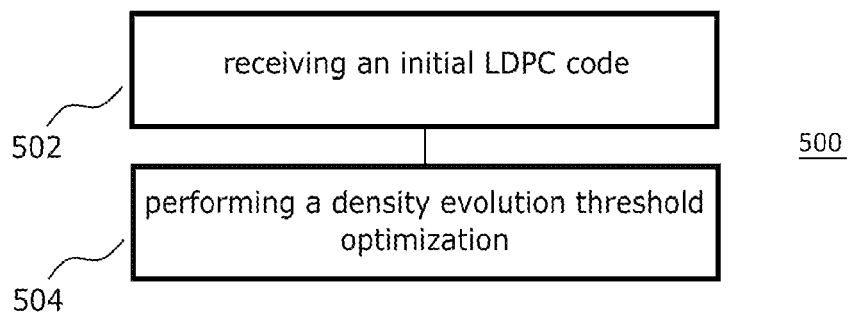
FIG. 5 illustrates a flowchart of an example of a method for generating an optimized LDPC code which is optimized for a plurality of transmission channels.
Figure 6:
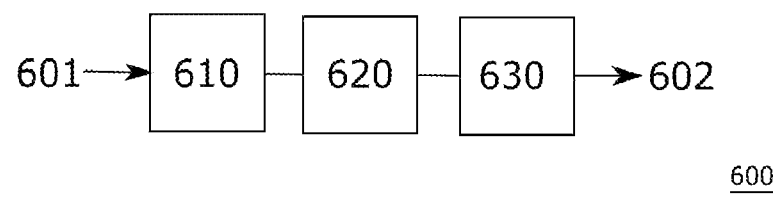
FIG. 6 illustrates an example of an apparatus for generating an optimized LDPC code which is optimized for a plurality of transmission channels.

There is not only a desire for LDPC codes being optimized to asymmetric transmission channels. In several practical systems the transmission channel can change. For example, in wireless systems, the transmission channel can change quickly depending on the coherence time. In storage systems, while the first read may only provide hard information of the bits, additional soft information may be requested on demand. Thus, there is a desire for LDPC codes that are simultaneously good for different transmission channels. FIG. 5 illustrates a flowchart of an example of a method 500 for generating an optimized LDPC code which is optimized for a plurality of transmission channels. The method 500 will be described in the following further with reference to FIG. 6 which illustrates an exemplary apparatus 600 for generating an optimized LDPC code which is optimized for a plurality of transmission channels.

The method 500 comprises receiving 502 an initial LDPC code. Accordingly, the apparatus 600 comprises input circuitry 610 configured to receive the initial LDPC code 601. The initial LDPC code is the LDPC code to be optimized for the plurality of transmission channels. In other words, the initial LDPC code serves as basis for the following code optimization process.

The method 500 additionally comprises performing 504 a DE threshold optimization for the initial LDPC code in order to obtain the optimized LDPC code. The apparatus 600 comprises a corresponding processing circuitry 620 for performing the DE threshold optimization for the initial LDPC code. For example, the processing circuitry 620 may be a single dedicated processor, a single shared processor, or a plurality of individual processors, some of which or all of which may be shared, a DSP hardware, an ASIC or an FPGA. The processing circuitry 620 may optionally be coupled to, e.g., ROM for storing software, RAM and/or non-volatile memory. The optimized LDPC code 602 as determined by the processing circuitry 620 is output by output circuitry 630 of the apparatus 600.

Optimizing the variable-node and check-node degree distribution to optimize the DE threshold is typically the first step towards LDPC code construction. This optimization is conventionally done for only one fixed class of channels such as a Binary Symmetric Channel (BSC), an AWGN Channel, a quantized soft channel, etc.

In order to account for plural transmission channels, at least one of a column degree distribution and a row degree distribution of the initial LDPC code is iteratively optimized in each iteration of the DE threshold optimization with respect to a plurality of DE thresholds for the plurality of transmission channels. For example, both of the column degree distribution and the row degree distribution of the initial LDPC code may be iteratively optimized in each iteration of the DE threshold optimization with respect to the plurality of DE thresholds for the plurality of transmission channels. That is, in the method 500, the threshold optimization is performed not for one class, but for multiple classes of transmission channels.

The optimized LDPC code resulting from such optimizations leads to good performance on a wide range of channels. The method 500 facilitates error-correction schemes based on LDPC codes with superior correctability, which may ultimately help to deliver cheaper and better products to the customers. By focusing on different channels at once, the method 500 facilitates the design of versatile error-correcting codes that support high input error-rate mitigation, which directly translates to cost reduction and quicker time to market.

Degree distribution optimization of LDPC codes proceeds by starting with a given pair of variable- and check-node degree distribution and iteratively selecting the next distribution by small perturbations and random search around the current distribution. Rather than evaluate and optimize the DE threshold for a fixed channel, for each variable-node and checknode degree distribution during the optimization, the method 500 evaluates the DE thresholds for different channels of interest. As the degree distributions change for the next iteration, for some channels, the thresholds improve and for other channels, the thresholds may worsen. Based on performance criteria selected for different channels, the method 500 may allow to either accept the new degree distribution or reject it for a potentially better selection later.

For example, the initial LDPC code may be initially set as the optimized LDPC code in the DE threshold optimization. Then, in i-th iterations with i≥1 (i being an integer), performing 504 the DE threshold optimization for the initial LDPC code comprises modifying at least one of the column degree distribution and the row degree distribution of the optimized LDPC code in order to obtain a modified LDPC code of the i-th iteration. For example, both the column degree distribution and the row degree distribution of the optimized LDPC code may be modified in order to obtain the modified LDPC code of the i-th iteration. Techniques such as hill climbing, simulated annealing, etc., may be used for modifying the column degree distribution and/or the row degree distribution of the optimized LDPC code in the i-th iteration. Further, when performing 504 the DE threshold optimization for the initial LDPC code in the i-th iterations, the respective DE threshold for the modified LDPC code of the i-th iteration is determined for each of the plurality of transmission channels. If the DE thresholds for the modified LDPC code of the i-th iteration satisfy a quality criterion, performing 504 the DE threshold optimization for the initial LDPC code comprises in i-th iterations updating the current optimized LDPC code to the modified LDPC code of the i-th iteration. On the other hand, if the DE thresholds for the modified LDPC code of the i-th iteration do not satisfy the quality criterion, performing 504 the DE threshold optimization for the initial LDPC code comprises in i-th iterations rejecting the modified LDPC code of the i-th iteration. In other words, the modified degree distribution(s) is/are either accepted or rejected in each iteration based on the quality criterion selected for the plurality of transmission channels.

Various quality criteria may be used for evaluating the modified degree distribution(s) in each iteration. In the following two exemplary quality criteria are described. However, it is to be noted that the method 500 is not limited thereto.

For example, a weighted optimization may be used. In this approach, rather than optimizing the DE threshold on a given channel, a weighted combination of thresholds corresponding to different channels is optimized. In terms of a mathematical expression, this may be formulated as follows:

$$\text{Maximize } w_1\theta_1 + w_2\theta_2 + \ldots + w_k\theta_k \quad (13)$$

with $\theta_l$ denoting the DE threshold corresponding to transmission channel "l" among the plurality of transmission channels (l=1 ... k) and $0 < w_l < 1$ denoting a relative weight associated to transmission channel "l" in the optimization.

In other words, updating the optimized LDPC code to the modified LDPC code of the i-th iteration comprises determining a weighted sum of the determined DE thresholds for the modified LDPC code of the i-th iteration. If the weighted sum of the determined DE thresholds for the modified LDPC code of the i-th iteration is larger than a weighted sum of DE thresholds for the current optimized LDPC code, the current optimized LDPC code is updated to the modified LDPC code of the i-th iteration.

According to other examples, a constrained optimization may be used. In this approach, performance is optimized on a given channel subject to a certain minimum on other channels. In terms of a mathematical expression, this may be formulated as follows:

$$\text{Maximize } \theta_1 \text{ subject to } \theta_2 > t_2, \theta_3 > t_3, \ldots, \theta_k > t_k \quad (14)$$

with $\theta_l$ denoting the DE threshold corresponding to transmission channel "l" among the plurality of transmission channels (l=1 ... k) and $t_l$ denoting a minimum DE threshold required for the respective transmission channel "l" in the optimization.

In other words, updating the optimized LDPC code to the modified LDPC code of the i-th iteration comprises comparing the determined DE threshold for the modified LDPC code of the i-th iteration for one of the plurality of transmission channels to a DE threshold for the current optimized LDPC code for the one of the plurality of transmission channels. If a) the determined DE threshold for the modified LDPC code of the i-th iteration for the one of the plurality of transmission channels is larger than the DE threshold for the current optimized LDPC code for the one of the plurality of transmission channels and b) the determined DE thresholds for the modified LDPC code of the i-th iteration for the other ones of the plurality of transmission channels are above respective threshold values, the current optimized LDPC code is updated to the modified LDPC code of the i-th iteration.

For example, by optimizing the initial LDPC code according to the method 500 using the constrained optimization while maximizing the threshold for an AWGN transmission channel, a gap to capacity of roughly 5% may be achieved for the AWGN transmission channel while the gap to capacity for a binary symmetric transmission channel may be at most 20%.

The method 500 allows to generate LDPC codes that are simultaneously good for different channels.

As mentioned above, a low error floor is another desired characteristic of an LDPC code. The error floor phenomenon is characterized by a significant degradation of the slope of the output error rate curve in the low input error rate regime in comparison to the high input error rate regime. The error floor phenomenon is particularly egregious when the block length of the LDPC codes is small (e.g. up to a few thousand bits), which is prevalent in many communication technologies (e.g. 5G New Radio or G.mgfast) or memory technologies.

Figure 7:
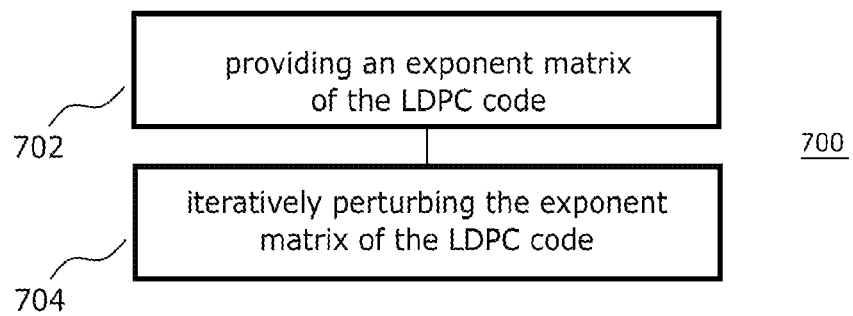
FIG. 7 illustrates a flowchart of an example of a method for optimizing an LDPC code.
Figure 8:
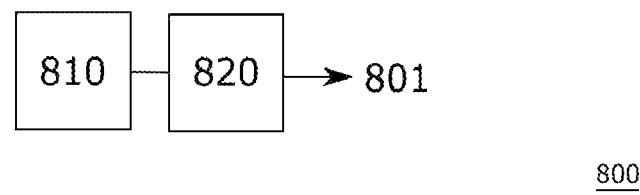
FIG. 8 illustrates an example of an apparatus for optimizing an LDPC code.

FIG. 7 illustrates a flowchart of an example of a method 700 for optimizing an LDPC code in order to achieve a very low error floor. The method 700 will be described in the following further with reference to FIG. 8 which illustrates an exemplary apparatus 800 for optimizing an LDPC code.

The LDPC code is specified by a (e.g. random) binary parity-check matrix with a predetermined (fixed) column-weight and row-weight profile, i.e. a predetermined column degree distribution and a predetermined row degree distribution. The parity-check matrix of the LDPC code is formed of a plurality of sub-matrices. The sub-matrices are circulant permutation matrices represented by a respective exponent q. The respective exponent of each sub-matrix indicates either a respective circular (e.g. right or left) shift of the respective sub-matrix with respect to an identity matrix or that the respective sub-matrix is equal to a zero matrix. In other words, the LDPC code is a quasi-cyclic LDPC code. The sub-matrices are of size Q×Q, i.e. each of them comprises Q rows and Q columns. That is, the quasi-cyclic LDPC code has a fixed column- and row-weight profile and its parity-check matrix can be split into blocks of Q×Q circulant permutation sub-matrices. q and Q are integers.

For example, for indicating the circular right shift (in the columns) of one of the sub-matrices from the Q×Q identity matrix, the exponent q may set for the respective sub-matrix to a single non-negative number such that $0 \leq q < Q$. For indicating that a sub-matrix is equal to the zero matrix, the exponent q may be set to −1. However, it is to be noted that these values are merely exemplary for easing the description of the proposed technology. According to aspects of the present disclosure, other values may be used for the exponent matrix.

For example, for Q=4, the identity matrix is $$\begin{matrix} 1 & 0 & 0 & 0 \\ 0 & 1 & 0 & 0 \\ 0 & 0 & 1 & 0 \\ 0 & 0 & 0 & 1 \end{matrix} \quad (15)$$

and the zero matrix is $$\begin{matrix} 0 & 0 & 0 & 0 \\ 0 & 0 & 0 & 0 \\ 0 & 0 & 0 & 0 \\ 0 & 0 & 0 & 0 \end{matrix} \quad (16)$$

In other words, the identity matrix is a matrix of size Q×Q that contains ones on the main diagonal and zeros elsewhere. The zero matrix is a matrix of size Q×Q all of whose entries are zero.

For example, for Q=4, the circulant permutation sub-matrix for the exponent q=2 is:

$$\begin{matrix} 0 & 0 & 1 & 0 \\ 0 & 0 & 0 & 1 \\ 1 & 0 & 0 & 0 \\ 0 & 1 & 0 & 0 \end{matrix} \quad (17)$$

The method 700 comprises providing 702 an exponent matrix of the LDPC code. Each entry in the exponent matrix is assigned to a respective one of the plurality of sub-matrices and indicates a value of the respective exponent. In other words, the LDPC code's parity-check matrix of size R×N is represented by an exponent matrix of size (R/Q)×(N/Q). R and N are integer multiples of Q such that (R/Q) and (N/Q) are integers.

Further, the method 700 comprises iteratively perturbing the exponent matrix of the LDPC code in order to increase a girth of the LDPC code. In other words, the exponent matrix of the LDPC code is (slightly) modified in each of one or more iterations in order to increase the girth of the LDPC code. The girth of the LDPC code denotes the shortest (smallest) cycle occurring in a Tanner graph representation of the LDPC code. For example, a girth of 6 indicates that the shortest cycle occurring in the Tanner graph representation of the LDPC code is of length 6. That is, no cycles of length n<6 occur in the Tanner graph representation of the LDPC code.

Short (small) cycles in the Tanner graph representation of the LDPC code cause so-called "trapping sets". A trapping set is a set of variable nodes in the Tanner graph representation of the LDPC code that do not converge to the correct value in decoding. Trapping sets are one of the main causes of the error floor in the LDPC code. By iteratively refining the LDPC code to progressively reduce the small cycle count (i.e. the number of smallest/shortest cycles in the Tanner graph representation of the LDPC code) and, hence, the girth of the LDPC code, the method 700 allows to improve the error floor in the LDPC code. Thus, the method 700 allows to generate LDPC codes that are superior compared to conventionally constructed LDPC codes. LDPC codes generated according to the method 700 may enable improved encoding and decoding in many applications such as communication technology (e.g. G.mgfast) or memory technology.

The apparatus 800 comprises a corresponding processing circuitry 810 for providing the exponent matrix of the LDPC code and iteratively perturbing the exponent matrix of the LDPC code as described for the method 700. For example, the processing circuitry 810 may be a single dedicated processor, a single shared processor, or a plurality of individual processors, some of which or all of which may be shared, a DSP hardware, an ASIC or a FPGA. The processing circuitry 810 may optionally be coupled to, e.g., ROM for storing software, RAM and/or non-volatile memory. The optimized LDPC code 801 as determined by the processing circuitry 810 is output by output circuitry 820 of the apparatus 800.

While various perturbation techniques may be used for iteratively perturbing the exponent matrix of the LDPC code, two exemplary perturbation techniques will be described in the following with respect to FIGS. 9 and 10. In particular, a first perturbation technique which may be understood as an "exponent perturbation" will be described with reference to FIG. 9 and a second perturbation technique which may be understood as a "column perturbation" will be described with reference to FIG. 10.

The choice of which of the two techniques to use may depend on various parameters such as a desired (target) application of the LDPC code to be optimized or parameters of the LDPC code. For example, for a fixed base matrix with a small Q value, column perturbation may give better LDPC codes, whereas for larger Q values, exponent perturbation may give better LDPC codes. The base matrix of the LDPC is a binary matrix of size (R/Q)×(N/Q) whose entries represents the entries in the exponent matrix of the LDPC code. For example, each non-negative exponent (e.g. ranging from 0≤q<Q) in the exponent matrix of the LDPC code may be represented by a one in the base matrix, and each negative exponent in the exponent matrix representing a sub-matrix equal to the zero matrix (e.g. being −1 as in the above example) may be represented by a zero in the base matrix. As such, the quasi-cyclic LDPC code maybe viewed as a "lifted" matrix from its projected base matrix. Thus, the quasi-cyclic LDPC can be represented with a base matrix and for each entry of "1" in the base matrix, the exponent takes value between 0 to Q−1. However, it is to be noted that these values are merely exemplary for easing the description of the proposed technology. According to aspects of the present disclosure, other values may be used for the entries of the base matrix. In other words, each entry in the base matrix of the LDPC code is assigned to a respective one of the plurality of sub-matrices and indicates whether the respective sub-matrix is equal to the zero matrix or a circularly shifted replica of the identity matrix. The base matrix may be graphically represented as a base graph, which is sometimes also denoted as protograph or projected graph of the LDPC code.

Exponent perturbation seeks to remove cycles of length n, which are sometimes denoted as n-cycles. A given n-cycle is incident (or connected) to n exponents in the exponent matrix of the LDPC code, and a given exponent maybe incident to several n-cycles. The fundamental of the exponent perturbation is to focus on the "worst" exponents (i.e. those with the largest incidence of n-cycles), replace that exponent, and optionally repeat the procedure.

Accordingly, in at least one iteration, iteratively perturbing 704 the exponent matrix of the LDPC code comprises determining, for each exponent in the exponent matrix of the LDPC code that indicates a respective circular shift of the respective sub-matrix with respect to the identity matrix, a number of cycles of length n in the Tanner graph representation of the LDPC code in which a node in the Tanner graph representation of the LDPC code that is represented by the sub-matrix assigned to the respective exponent occurs. For example, referring to the above example, for each exponent q in the exponent matrix of the LDPC code that satisfies 0≤q<Q, the number of cycles of length n in the Tanner graph representation of the LDPC code in which a node in the Tanner graph representation of the LDPC code that is represented by the sub-matrix assigned to the respective exponent occurs is determined. In other words, the n-cycles incident to all non-zero entries in the base matrix may be enumerated, and for each exponent indicating a respective non-zero entry in the base matrix, the number of n-cycles it is incident to may be determined.

Figure 9:
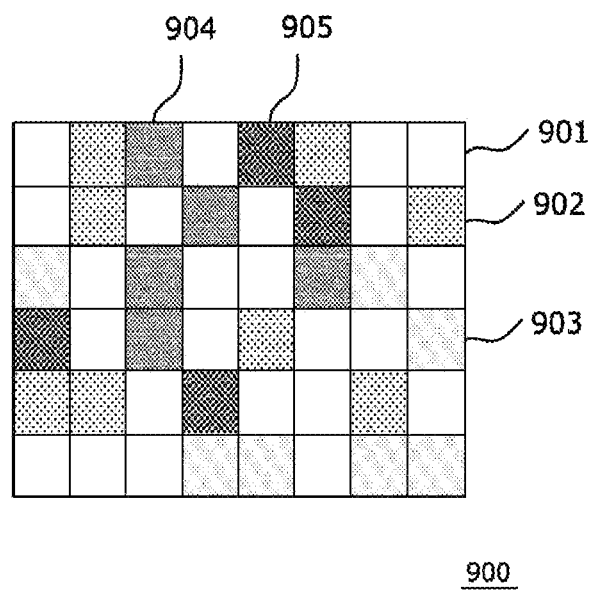
FIG. 9 illustrates a flowchart of an exemplary process flow for optimizing an LDPC code.

An exemplary cycle count profile 900 for cycles of length n is illustrated in FIG. 9. FIG. 9 illustrates an exemplary 6×8 exponent matrix. For each entry of the 6×8 exponent matrix, a respective color/hatching denotes the number of cycles of length n in the Tanner graph representation of the LDPC code in which a node in the Tanner graph representation of the LDPC code that is represented by the sub-matrix assigned to the respective exponent occurs. The color/hatching 901 denotes that the sub-matrix assigned to the respective exponent is a zero matrix and is, hence, not involved in any cycles of length n. The color/hatching 902 denotes that the sub-matrix assigned to the respective exponent is incident to (involved in) a small number cycles of length n in the Tanner graph representation of the LDPC code. The color/hatching 903 denotes that the sub-matrix assigned to the respective exponent is incident to (involved in) a medium number cycles of length n in the Tanner graph representation of the LDPC code. The color/hatching 904 denotes that the sub-matrix assigned to the respective exponent is incident to (involved in) a high number cycles of length n in the Tanner graph representation of the LDPC code. The color/hatching 905 denotes that the sub-matrix assigned to the respective exponent is incident to (involved in) a very high number cycles of length n in the Tanner graph representation of the LDPC code.

Further, in at least one iteration, iteratively perturbing 704 the exponent matrix of the LDPC code comprises randomly selecting an exponent among those exponents in the exponent matrix of the LDPC code exhibiting the a % highest numbers of cycles of length n. The value "a" is a threshold value and can be tuned and selected depending on various parameters (e.g. the scope) of the LDPC code optimization. For example, the value "a" may be at least 10 and at maximum 50. According to some example, the value "a" may be 20. For example, all exponents illustrated with the color/hatching 905 in FIG. 9 may be exponents in the exponent matrix of the LDPC code exhibiting the a % highest numbers of cycles of length n. Accordingly, one of the exponents illustrated with the color/hatching 905 in FIG. 9 is randomly selected according to the proposed method. The exponents in the exponent matrix of the LDPC code exhibiting the a % highest numbers of cycles of length n are the "worst" exponents as they are involved in the most cycles of length n. In other words, the exponents may be ordered from the largest to smallest n-cycles they are incident to and an exponent in the worst, e.g., 20 percentile may be randomly picked.

Subsequently, in at least one iteration, iteratively perturbing 704 the exponent matrix of the LDPC code comprises determining, for each value within a value range from 0 and Q−1 under the assumption that the current value of the randomly selected exponent is changed to the respective value within the value range, a respective hypothetic number of cycles of length n in which a node in the Tanner graph representation of the LDPC code that is represented by the sub-matrix assigned to the randomly selected exponent occurs. That is, the randomly selected exponent is changed to each value within the value range from 0 and Q−1 and for each of these values the respective hypothetic number of cycles of length n in which a node in the Tanner graph representation of the LDPC code that is represented by the sub-matrix assigned to the randomly selected exponent occurs is determined. For example, for Q=4, the randomly selected exponent is changed to 0, 1, 2 and 3. For each of 0, 1, 2 and 3, it is determined the respective hypothetic number of cycles of length n in which a node in the Tanner graph representation of the LDPC code that is represented by the sub-matrix assigned to the randomly selected exponent occurs. For reasons of processing, the current value of the randomly selected exponent may optionally be changed to −1 before changing it to each value within the value range from 0 and Q−1.

Then, the current value of the randomly selected exponent is updated to a value among those values within the value range causing the i % lowest numbers of cycles of length n. The value "i" is a threshold value and can be tuned and selected depending on various parameters of the LDPC code optimization. For example, the value "i" may be at maximum 25. The values within the value range causing the i % lowest numbers of cycles of length n are the "best" values for the randomly selected exponent as they cause involvement of the randomly selected exponent in the least cycles of length n.

In other words, for the chosen exponent, the incident n-cycles are calculated for each value between 0 to Q−1. Then, one of the best values between 0 to Q−1 is chosen and the choice is set as the new value of the exponent.

For example, the current value of the randomly selected exponent may be updated to the value within the value range causing the lowest numbers of cycles of length n. That is, the best choice may be set as the new value of the exponent. Alternatively, the current value of the randomly selected exponent may be updated to a randomly selected value among those values within the value range causing the i % lowest numbers of cycles of length n. That is, a uniformly random value among the best choices may be set as the new value of the exponent. The random selection may allow to break ties.

The above processing is carried out in at least one iteration for removing (reducing) cycles of length n in the Tanner graph representation of the LDPC code. According to examples, the above processing may be carried out iteratively in a plurality of iterations. For example, the above processing may be iteratively repeated until a (predefined) maximum number of iterations is reached or until no more cycles of the length n are present in the Tanner graph representation of the LDPC code.

The above processing may analogously be repeated for removing (reducing) cycles of length m>n in the Tanner graph representation of the LDPC code (n and m are integers). That is, in at least one further iteration, iteratively perturbing 704 the exponent matrix of the LDPC code may comprise determining, for each exponent in the exponent matrix of the LDPC code that indicates a respective circular shift of the respective sub-matrix with respect to the identity matrix, a number of cycles of length m in the Tanner graph representation of the LDPC code in which a node in the Tanner graph representation of the LDPC code that is represented by the sub-matrix assigned to the respective exponent occurs. Further, an exponent among those exponents in the exponent matrix of the LDPC code exhibiting the b % highest numbers of cycles of length m may be randomly selected. The value "b" is a threshold value similar to the above value "a". The value "b" may, e.g., be at least 10 and at maximum 50. According to some example, the value "b" may be 20. The value "b" may be identical to or be different from the value "a".

Further, in at least one further iteration, iteratively perturbing 704 the exponent matrix of the LDPC code may comprise determining, for each value within the value range from 0 and Q−1 under the assumption that the current value of the randomly selected exponent is changed to the respective value within the value range, a respective hypothetic number of cycles of length m in which a node in the Tanner graph representation of the LDPC code that is represented by the sub-matrix assigned to the randomly selected exponent occurs. Further, the current value of the randomly selected exponent may be updated to a value among those values within the value range causing the j % lowest numbers of cycles of length m. The value "j" is a threshold value similar to the above value "i". For example, the value "j" may be at maximum 25. The value "j" may be identical to or be different from the value "i".

In the above procedure, a given exponent is optimized based on the choice of the rest of the exponents. As such, a given entry in the base matrix/exponent matrix may be chosen multiple times over the entire perturbation procedure for optimization.

In the column perturbation technique, in contrast to the exponent perturbation, it is focused on an entire column (and all its exponents) of the exponent/base matrix at once rather than just one exponent at a time. A given n-cycle will be incident (or connected) to n/2 columns in the exponent/base matrix (including repetitions), and a given column in the exponent/base matrix maybe incident to several n-cycles. Along similar lines as exponent perturbation that focused on the worst exponents, column perturbation focuses on the worst columns (with largest incidence of n-cycles). The worst columns are perturbed (i.e. exponents are repopulated for cycle reduction) and the procedure may be iteratively repeated. Primarily, in column perturbation, not just the value of the exponents but even the locations of the "1" entries in the base matrix (i.e. those entries indicating that the respective assigned sub-matrix is a circularly shifted replica of the identity matrix) are changed. Accordingly, small cycles in the Tanner graph representation of the LDPC code are removed/reduced.

In at least one iteration, iteratively perturbing 704 the exponent matrix of the LDPC code comprises determining, for each column in the exponent matrix of the LDPC code, a number of cycles of length n in the Tanner graph representation of the LDPC code in which a node in the Tanner graph representation of the LDPC code that is represented by sub-matrices assigned to the respective column occurs. In contrast to the exponent perturbation, the number of cycles of length n is determined for each column in the exponent matrix of the LDPC code rather than for each exponent in the exponent matrix of the LDPC code. In other words, all n-cycles may be enumerated, and for each column in the base matrix, the number of n-cycles it is incident to may be determined.

Figure 10:
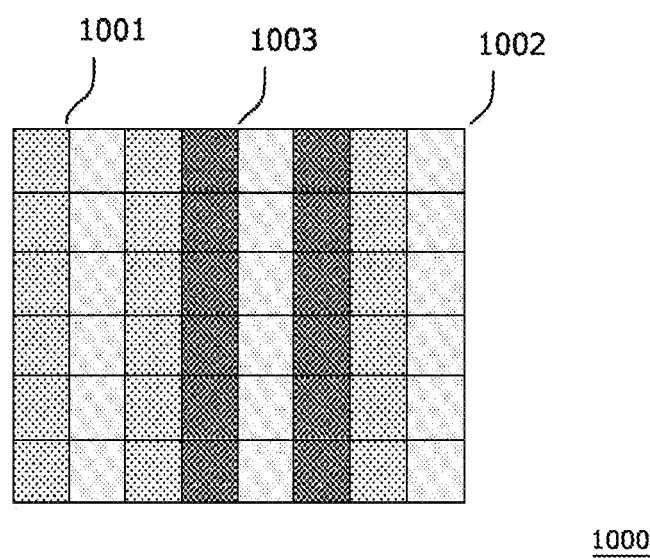
FIG. 10 illustrates a first example of a cycle count profile.

An exemplary cycle count profile 1000 for cycles of length n is illustrated in FIG. 10. FIG. 10 illustrates an exemplary 6×8 exponent matrix. For each entry of the 6×8 exponent matrix, a respective color/hatching denotes the number of cycles of length n in the Tanner graph representation of the LDPC code in which a node in the Tanner graph representation of the LDPC code that is represented by sub-matrices assigned to the respective column of the 6×8 exponent matrix occurs. The color/hatching 1001 denotes that the sub-matrices assigned to the respective column are incident to (involved in) a small number cycles of length n in the Tanner graph representation of the LDPC code. The color/hatching 1002 denotes that the sub-matrices assigned to the respective column are incident to (involved in) a medium number cycles of length n in the Tanner graph representation of the LDPC code. The color/hatching 1003 denotes that the sub-matrices assigned to the respective column are incident to (involved in) a high number cycles of length n in the Tanner graph representation of the LDPC code.

Further, in at least one iteration, iteratively perturbing 704 the exponent matrix of the LDPC code comprises randomly selecting a column among those columns in the exponent matrix of the LDPC code exhibiting the a % highest numbers of cycles of length n. The value "a" is threshold value similar to what is described above for the exponent perturbation. Further details about the value "a" can be found above in the description of the exponent perturbation. For example, all columns illustrated with the color/hatching 1003 in FIG. 10 may be exponents in the exponent matrix of the LDPC code exhibiting the a % highest numbers of cycles of length n. Accordingly, one of the exponents illustrated with the color/hatching 1003 in FIG. 10 is randomly selected according to the proposed method. The columns in the exponent matrix of the LDPC code exhibiting the a % highest numbers of cycles of length n are the "worst" columns as they are involved in the most cycles of length n. In other words, the columns may be ordered from the largest to smallest n-cycles they are incident to and a columns in the worst, e.g., 20 percentile may be randomly picked.

Subsequently, in at least one iteration, iteratively perturbing 704 the exponent matrix of the LDPC code comprises permuting entries in the base matrix of the LDPC code that correspond to the randomly selected column. That is, the entries in the base matrix of the LDPC code that correspond to the randomly selected column are permuted. For example, one or more entries in the base matrix of the LDPC code that indicate ones may be changed to zeros, and vice versa. Any constraint may be used for permuting the entries in the base matrix of the LDPC code that correspond to the randomly selected column.

Subsequently, in at least one iteration, iteratively perturbing 704 the exponent matrix of the LDPC code comprises randomly setting a total of g entries among those entries in the base matrix of the LDPC code that correspond to the randomly selected column to indicate that the respectively assigned sub-matrix is a circularly shifted replica of the identity matrix. The value "g" is the predetermined column degree of the randomly selected column. For example, referring to the above example, g entries among those entries in the base matrix of the LDPC code that correspond to the randomly selected column may be set to "1" in order to indicate that the respectively assigned sub-matrix is a circularly shifted replica of the identity matrix. Accordingly, the column degree of the randomly selected column may be preserved. In other words, g positions in the column may be randomly generated and those entries may be set to 1 in the base matrix, where g is the column weight of the column being generated. For reasons of processing, the current values of the exponents in the randomly selected exponent may optionally be changed to −1 in the exponent matrix before randomly setting the g entries in the base matrix of the LDPC code.

Further, in at least one iteration of the iterative perturbation of the exponent matrix, the following is performed for each of the g randomly set entries in the base matrix:

Determining, for each value within a value range from 0 and Q−1 under the assumption that a current value of a respective exponent in the randomly selected column is changed to the respective value within the value range, a respective hypothetic number of cycles of length n in the Tanner graph representation of the LDPC code in which a node in the Tanner graph representation of the LDPC code that is represented by the sub-matrix assigned to the respective exponent in the randomly selected column occurs. The respective exponent in the randomly selected column corresponds to the respective randomly set entry in the base matrix. That is, for each randomly set entry in the randomly selected column in the base matrix of the LDPC code, the corresponding exponent in the exponent matrix of the LDPC code is changed to each value within the value range from 0 and Q−1. Further, for each of these values the respective hypothetic number of cycles of length n in which a node in the Tanner graph representation of the LDPC code that is represented by the sub-matrix assigned to the respective exponent in the randomly selected column occurs is determined. For example, for Q=4, the respective exponent in the randomly selected column is changed to 0, 1, 2 and 3. For each of 0, 1, 2 and 3, it is determined the respective hypothetic number of cycles of length n in which a node in the Tanner graph representation of the LDPC code that is represented by the sub-matrix assigned to the respective exponent in the randomly selected column occurs.

Then, the current value of the respective exponent in the randomly selected column is updated to a value among those values within the value range causing the i % lowest numbers of cycles of length n for the respective exponent in the randomly selected column. The value i is threshold value similar to what is described above for the exponent perturbation. Further details about the value "i" can be found above in the description of the exponent perturbation. The values within the value range causing the i % lowest numbers of cycles of length n are the "best" values for the respective exponent in the randomly selected column as they cause involvement of the respective exponent in the randomly selected column in the least cycles of length n.

For example, the above processing for each of the g randomly set entries in the base matrix may be performed from the top of the column to the bottom such that it is performed from the top of the column to the bottom for each entry of, e.g., "1" in the base matrix. For the chosen exponent, the incident n-cycles are calculated for each value between 0 to Q−1. Then, one of the best values between 0 to Q−1 is chosen and the choice is set as the new value of the exponent.

For example, the current value of the respective exponent in the randomly selected column may be updated to the value within the value range causing the lowest numbers of cycles of length n for the respective exponent. That is, the best choice may be set as the new value of the respective exponent. Alternatively, the current value of the respective exponent in the randomly selected column may be updated to a randomly selected value among those values within the value range causing the i % lowest numbers of cycles of length n for the respective exponent. That is, a uniformly random value among the best choices may be set as the new value of the exponent. The random selection may allow to break ties.

Once, the above processing is performed for each of the g randomly set entries in the base matrix, it is decided whether or nor the changes are accepted. Unlike in the exponent perturbation, an iteration of the column perturbation might result in a higher n-cycle count such that an acceptance/rejection decision is needed. The changes to the entries of the base matrix and the exponent matrix for the randomly selected column are only accepted in the respective iteration if the changes do not increase a total number of cycles of length n for the randomly selected column.

The above processing is carried out in at least one iteration for removing (reducing) cycles of length n in the Tanner graph representation of the LDPC code. According to examples, the above processing may be carried out iteratively in a plurality of iterations. For example, the above processing may be iteratively repeated until a (predefined) maximum number of iterations is reached or until no more cycles of the length n are present in the Tanner graph representation of the LDPC code.

The above processing may analogously be repeated for removing (reducing) cycles of length m>n in the Tanner graph representation of the LDPC code (n and m are integers). That is, in at least one further iteration, iteratively perturbing 704 the exponent matrix of the LDPC code may comprise determining, for each column in the exponent matrix of the LDPC code, a number of cycles of length m in the Tanner graph representation of the LDPC code in which a node in the Tanner graph representation of the LDPC code that is represented by sub-matrices assigned to the respective column occurs. Further, a column among those columns in the exponent matrix of the LDPC code exhibiting the b % highest numbers of cycles of length m may be randomly selected. The value "b" is a threshold value similar to the above value "a". The value "b" may, e.g., be at least 10 and at maximum 50. According to some example, the value "b" may be 20. The value "b" may be identical to or be different from the value "a".

Further, in at least one further iteration, iteratively perturbing 704 the exponent matrix of the LDPC code may comprise permuting entries in the base matrix of the LDPC code that correspond to the randomly selected column among those columns in the exponent matrix of the LDPC code exhibiting the b % highest numbers of cycles of length m.

Subsequently, in at least one further iteration, iteratively perturbing 704 the exponent matrix of the LDPC code may comprise randomly setting a total of h entries among those entries in the base matrix of the LDPC code that correspond to the randomly selected column to indicate that the respectively assigned sub-matrix is a circularly shifted replica of the identity matrix. The value "h" is the predetermined column degree of the randomly selected column among those columns in the exponent matrix of the LDPC code exhibiting the b % highest numbers of cycles of length m.

Further, the following is performed for each of the h randomly set entries in the base matrix:

Determining, for each value within the value range from 0 and Q−1 under the assumption that the current value of a respective exponent in the randomly selected column is changed to the respective value within the value range, a respective hypothetic number of cycles of length m in the Tanner graph representation of the LDPC code in which a node in the Tanner graph representation of the LDPC code that is represented by the sub-matrix assigned to the respective exponent in the randomly selected column occurs. The respective exponent in the randomly selected column corresponds to the respective randomly set entry in the base matrix.

Further, the current value of the respective exponent in the randomly selected column is updated to a value among those values within the value range causing the j % lowest numbers of cycles of length m for the respective exponent in the randomly selected column. The value "j" is a threshold value similar to the above value "i". For example, the value "j" may be at maximum 25. The value "j" may be identical to or be different from the value "i".

Similar to what is described above for the reduction of the n-cycles, the changes to the entries of the base matrix and the exponent matrix for the randomly selected column are only accepted in the respective iteration if the changes do not increase a total number of cycles of length m for the randomly selected column.

As indicated above, iteratively perturbing the exponent matrix of the LDPC code may be performed several times in succession for cycles of different length. For example, iteratively perturbing the exponent matrix of the LDPC code in order to increase the girth of the LDPC code may comprise in the following order: iteratively perturbing the exponent matrix of the LDPC code in order to minimize cycles of length n in a Tanner graph representation of the LDPC code, and iteratively perturbing the exponent matrix of the LDPC code in order to minimize cycles of length m in the Tanner graph representation of the LDPC code. As described above, n<m.

The two above described perturbation techniques allow to iteratively optimize (reduce) the number of n-cycles for a given number "n". In order to facilitate the perturbation of the LDPC code, the exponent matrix of the LDPC code may be provided such that a girth of the LDPC code is larger than four.

While various techniques may be used for providing 702 the exponent matrix of the LDPC code, two exemplary techniques will be described in the following. However, it is to be noted that the method 700 is not limited thereto.

For example, providing 702 the exponent matrix of the LDPC code may comprise generating the exponent matrix of the LDPC code and the base matrix of the LDPC code by Progressive Edge Growth (PEG) or a variant thereof (e.g. Approximate Cycle Extrinsic message degree, ACE, constrained PEG) based on a predetermined column degree and row degree distribution for the LDPC code until a girth of the LDPC code is larger than four.

Figures 11, 12:
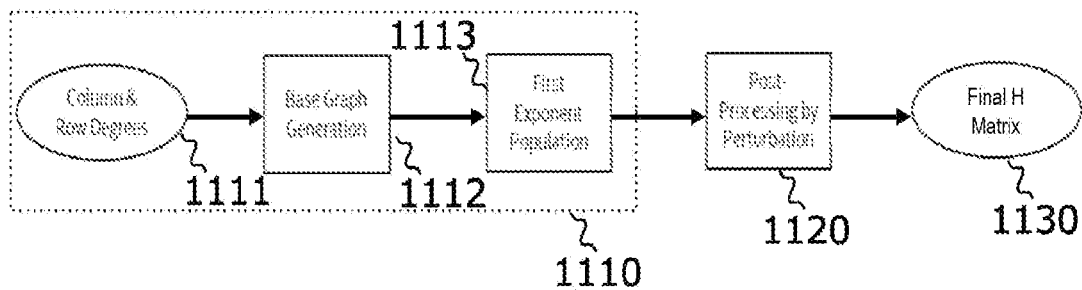
FIG. 11 illustrates a second example of a cycle count profile.
FIG. 12 illustrates a first example of an optimization order.

An alternative technique for providing 702 the exponent matrix of the LDPC code is illustrated in FIG. 11. FIG. 11 illustrates a process flow for generating an optimized LDPC codes that shows further details of the provisioning of the exponent matrix of the LDPC code. The example of FIG. 11 is a mere detailed example of the method 700 described above.

The provisioning 1110 the exponent matrix of the LDPC code comprises plural processes/steps. A predetermined column degree and row degree distribution 1111 for the LDPC code is given (input). Then, providing 1110 the exponent matrix of the LDPC code comprises generating 1112 a (e.g. random) base matrix of the LDPC code based on the predetermined column degree and row degree distribution for the LDPC code. In other words, given the column and row degrees of the target (desired) LDPC code, a random base matrix that satisfies the column and row degree profile may be generated. For example, if the LDPC code is to have erased bits, either due to puncturing (like in several communications standards such as 5G, passive optical networks, G.mgfast, etc.) or for protection from a failed die (a limiting failure mode in memory technology), then recoverability constraints or other constraints can be imposed on the base matrix construction.

Further, providing 1110 the exponent matrix of the LDPC code comprises generating 1113 the exponent matrix of the LDPC code by randomly assigning a value between 0 and Q−1 to the respective exponent of each of the plurality of sub-matrices for which the base matrix of the LDPC code indicates that the sub-matrix is a circularly shifted replica of the identity matrix until a girth of the LDPC code is larger than four. For example, referring the above example, a value between 0 and Q−1 may be assigned to each exponent/entry in the exponent matrix for which the corresponding base matrix entry is "1". Similarly, the value "−1" may be assigned to each exponent/entry in the exponent matrix for which the corresponding base matrix entry is "0".

In other words, the exponents are chosen randomly in the example of FIG. 11, but only those exponents that produce a Tanner graph of girth greater than 4. That is, for each entry of "1" in the base graph, an exponent between 0 and Q−1 is randomly chosen by dropping the choice of any exponents that produces 4-cycles. At this stage of the LDPC conde construction, although a valid quasi cyclic LDPC code has been generated, this LDPC code suffers from early error floor. This is because although a girth 6 has been ensured for the constructed LDPC code, the number of 6-cycles has not been reduced yet.

Therefore, the process flow subsequently comprises iteratively perturbing 1120 the LDPC code according to the above described techniques in order to improve the LDPC code obtained after the first exponent population. Accordingly, an optimized parity-check matrix 1130 of the LDPC code is obtained. The thus optimized LDPC code may outperform conventional LDPC codes. In other words, once base graph is generated, the exponents are at first randomly populated and then subject to post-processing by perturbation.

The above explanations focused on the basics of the different techniques for iterative perturbation. In the following some specific perturbation schemes will be described with reference to FIGS. 12 to 14. However, it is to be noted that the present technique is not limited thereto. For example, in the first exponent population described with respect to FIG. 11, only 4-cycles are avoided. As such, after the first exponent population, the LDPC code can potentially have 6-, 8-, and 10-cycles and higher. The perturbation techniques can be used to optimize any of these cycles in any desired (target) order. The general principle is to reduce the cycles of length equal to the current girth of the code. For example, if there are 6-cycles, the perturbation is applied to minimize 6-cycles. After that if there are no more 6-cycles, the perturbation is applied to minimize 8-cycles, etc. This order of optimization also changes with the nature of the column degrees present in the code. FIGS. 12 to 14 illustrate exemplary orders of the optimization to minimize the error floor in the LDPC code based on the minimum column weight present in the LDPC code.

The optimization order 1200 illustrated in FIG. 12 refers to the situation that the minimum column degree of the provided LDPC code is four or more (i.e. the LDPC code subject to the iterative perturbation exhibits a minimum column degree of four or more). Accordingly, iteratively perturbing 704 the exponent matrix of the LDPC code in order to increase the girth of the LDPC code comprises in the following order:

First, iteratively perturbing the exponent matrix of the LDPC code in order to remove all cycles of length 4 in a Tanner graph representation of the LDPC code. Second, iteratively perturbing the exponent matrix of the LDPC code in order to minimize cycles of length 6 in the Tanner graph representation of the LDPC code. Third, iteratively perturbing the exponent matrix of the LDPC code in order to minimize cycles of length 8 in the Tanner graph representation of the LDPC code. Fourth, iteratively perturbing the exponent matrix of the LDPC code in order to minimize cycles of length 10 in the Tanner graph representation of the LDPC code.

The optimization order 1300 illustrated in FIG. 13 refers to the situation that the minimum column degree of the provided LDPC code is three (i.e. the LDPC code subject to the iterative perturbation exhibits a minimum column degree of three). Accordingly, iteratively perturbing 704 the exponent matrix of the LDPC code in order to increase the girth of the LDPC code comprises in the following order:

First, iteratively perturbing the exponent matrix of the LDPC code in order to remove all cycles of length 4 in the Tanner graph representation of the LDPC code in which a node in the Tanner graph representation of the LDPC code that is represented by a sub-matrix assigned to any column of the exponent matrix with a column degree of four or more occurs.

Secondly, iteratively perturbing the exponent matrix of the LDPC code in order to remove all cycles of length 6 in the Tanner graph representation of the LDPC code in which a node in the Tanner graph representation of the LDPC code that is represented by a sub-matrix assigned to any column of the exponent matrix with a column degree of three occurs. Third, iteratively perturbing the exponent matrix of the LDPC code in order to minimize cycles of length 8 in the Tanner graph representation of the LDPC code in which a node in the Tanner graph representation of the LDPC code that is represented by a sub-matrix assigned to any column of the exponent matrix with a column degree of three occurs. Fourth, iteratively perturbing the exponent matrix of the LDPC code in order to minimize cycles of length 10 in the Tanner graph representation of the LDPC code in which a node in the Tanner graph representation of the LDPC code that is represented by a sub-matrix assigned to any column of the exponent matrix with a column degree of three occurs.

The optimization order 1400 illustrated in FIG. 14 refers to the situation that the minimum column degree of the provided LDPC code is two (i.e. the LDPC code subject to the iterative perturbation exhibits a minimum column degree of two). Accordingly, iteratively perturbing 704 the exponent matrix of the LDPC code in order to increase the girth of the LDPC code comprises in the following order:

First, iteratively perturbing the exponent matrix of the LDPC code in order to remove all cycles of length 4 in the Tanner graph representation of the LDPC code in which a node in the Tanner graph representation of the LDPC code that is represented by a sub-matrix assigned to any column of the exponent matrix with a column degree of four or more occurs. Second, iteratively perturbing the exponent matrix of the LDPC code in order to remove all cycles of length 6 in the Tanner graph representation of the LDPC code in which a node in the Tanner graph representation of the LDPC code that is represented by a sub-matrix assigned to any column of the exponent matrix with a column degree of two or three occurs. Third, iteratively perturbing the exponent matrix of the LDPC code in order to remove all cycles of length 6 in the Tanner graph representation of the LDPC code in which a node in the Tanner graph representation of the LDPC code that is represented by a sub-matrix assigned to any column of the exponent matrix with a column degree of three occurs. Fourth, iteratively perturbing the exponent matrix of the LDPC code in order to minimize cycles of length 6 in the Tanner graph representation of the LDPC code in which a node in the Tanner graph representation of the LDPC code that is represented by a sub-matrix assigned to any column of the exponent matrix with a column degree of two or more occurs. Fifth, iteratively perturbing the exponent matrix of the LDPC code in order to remove all cycles of length 8 in the Tanner graph representation of the LDPC code in which a node in the Tanner graph representation of the LDPC code that is represented by a sub-matrix assigned to any column of the exponent matrix with a column degree of two or three occurs. Sixth, iteratively perturbing the exponent matrix of the LDPC code in order to minimize cycles of length 8 in the Tanner graph representation of the LDPC code in which a node in the Tanner graph representation of the LDPC code that is represented by a sub-matrix assigned to any column of the exponent matrix with a column degree of three occurs. Seventh, iteratively perturbing the exponent matrix of the LDPC code in order to minimize cycles of length 10 in the Tanner graph representation of the LDPC code in which a node in the Tanner graph representation of the LDPC code that is represented by a sub-matrix assigned to any column of the exponent matrix with a column degree of two or three occurs. Eighth, iteratively perturbing the exponent matrix of the LDPC code in order to minimize cycles of length 8 in the Tanner graph representation of the LDPC code in which a node in the Tanner graph representation of the LDPC code that is represented by a sub-matrix assigned to any column of the exponent matrix with a column degree of two or more occurs.

In the examples of FIGS. 13 and 14, the LDPC code is not iteratively perturbed in order to remove cycles in the Tanner graph representation of the LDPC code in which a node in the Tanner graph representation of the LDPC code that is represented by a sub-matrix of any column that is labelled with "-" in FIGS. 13 and 14.

In the examples of FIGS. 13 and 14, the LDPC code need not be iteratively perturbed in order to remove cycles in the Tanner graph representation of the LDPC code in which a node in the Tanner graph representation of the LDPC code that is represented by a sub-matrix of any column that is labelled with "X" in FIGS. 13 and 14. However, the LDPC code may optionally be iteratively perturbed in order to remove cycle for such nodes.

Figure 15:
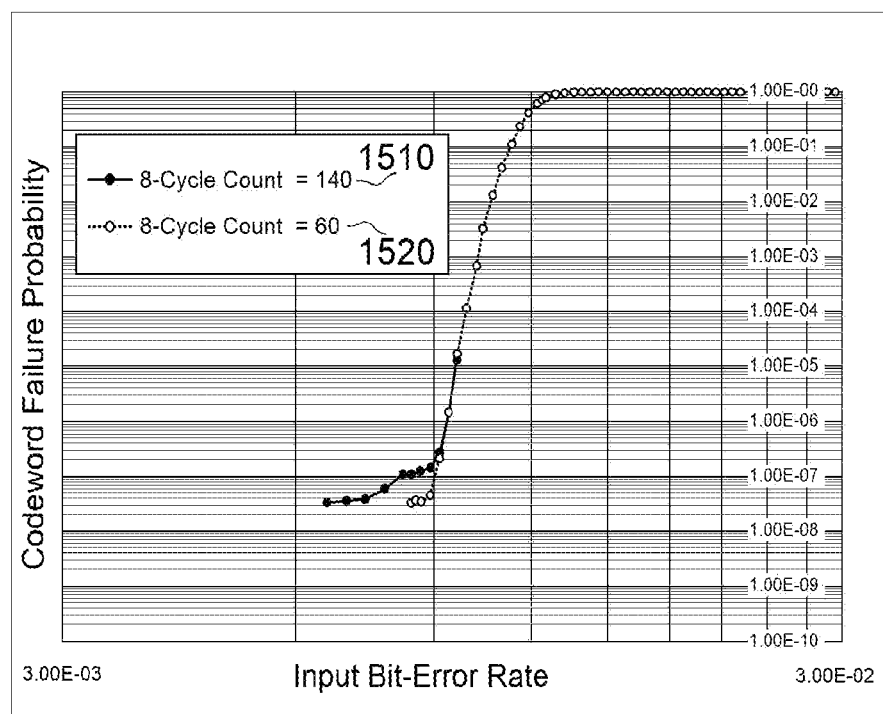
FIG. 15 illustrates an exemplary performance comparison between an optimized LDPC code and a reference LDPC code.

FIG. 15 illustrates an exemplary performance comparison between an LDPC code optimized according to the method 700 and a reference LDPC code generated using conventional approaches. Both LDPC codes are 4 kB (kilobyte) long. In particular, line 1520 illustrates the course of the output BER over the input BER for the LDPC code optimized according to the method 700. As a reference, line 1510 illustrates the course of the output BER over the input BER for the reference LDPC code. Both the LDPC code optimized according to the method 700 and the reference LDPC code exhibit a girth of 8. However, the number of cycles of length 8 is significantly lower for the LDPC code optimized according to the method 700 than for the reference LDPC code (80 cycles vs. 140 cycles of length 8).

As can be seen from FIG. 15, the output BER is significantly lower for the LDPC code optimized according to the method 700 compared to the reference LDPC code for lower input BERs. In other words, the LDPC code optimization according to the method 700 results in an improved correction strength of the LDPC code in the error floor region.

Figure 16:
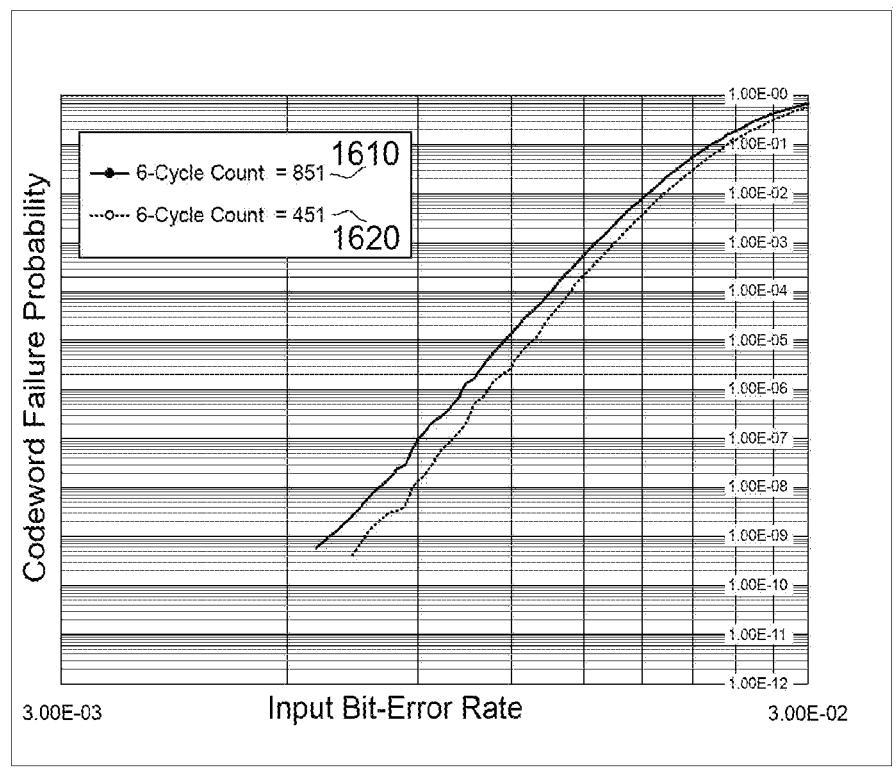
FIG. 16 illustrates an exemplary performance comparison between two optimized LDPC codes.

FIG. 16 illustrates an exemplary performance comparison between two LDPC codes optimized according to the method 700. Both LDPC codes are 128 bytes long. In particular, line 1610 illustrates the course of the output BER over the input BER for the LDPC code optimized according to the method 700 using exponent perturbation. Line 1620 illustrates the course of the output BER over the input BER for the LDPC code optimized according to the method 700 using column perturbation. Both LDPC codes exhibit a girth of 6. In this example, the number of cycles of length 6 is significantly lower for the LDPC code optimized using column perturbation than for the LDPC code optimized using exponent perturbation (451 cycles vs. 851 cycles of length 8).

As can be seen from FIG. 16, the output BER is significantly lower for the LDPC code optimized using column perturbation compared to the LDPC code optimized using exponent perturbation over the whole range of input BERs. In other words, the LDPC code optimization using column perturbation results in an improved correction strength of the LDPC code in this example.

Figure 17:
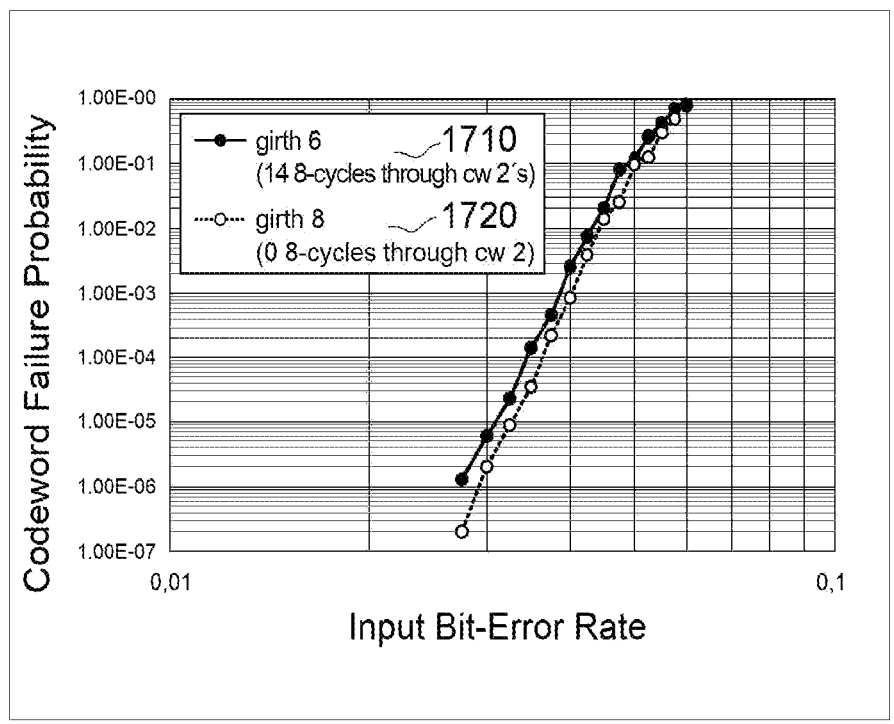
FIG. 17 illustrates an exemplary performance comparison between two LDPC codes of different girth.

FIG. 17 further illustrates an exemplary performance comparison between two LDPC codes of different girth. Both LDPC codes are 200 bytes long. In particular, line 1720 illustrates the course of the output BER over the input BER for an LDPC code optimized according to the method 700 using exponent perturbation. As a reference, line 1710 illustrates the course of the output BER over the input BER for a reference LDPC code generated using conventional approaches. The reference LDPC code exhibits a girth of 6, while the LDPC code optimized according to the method 700 using exponent perturbation achieves a girth of 8. The reference LDPC causes 14 cycles of length 8 that involve columns with a column degree (weight) of 2. The LDPC code optimized according to the method 700 using exponent perturbation causes 0 cycles of length 8 that involve columns with a column degree of 2.

Nodes in the Tanner graph representation of the LDPC code relating to columns with a column degree of 2 are the most vulnerable ones. Therefore, reducing the number of cycles incident to columns of column degree 2 is desired. Using exponent perturbation, not only all the 8-cycles incident columns of column degree 2 are removed but also the girth of the LDPC code is increased from 6 to 8. As can be seen from FIG. 17, the output BER is significantly lower for the LDPC code optimized according to the method 700 using exponent perturbation compared to the reference LDPC code over the whole range of input BERs.

It is evident from FIGS. 15 to 17 that the method 700 is an efficient technique to construct LDPC codes with very low error floors. In particular, the method 700 may allow to obtain LDPC codes for usage in applications that require a high reliability. The above described perturbation technologies allow to obtain LDPC codes with fewer cycles and as a result low error floor. The proposed perturbation techniques allow to eliminate small cycles progressively and effectively in the LDPC code's Tanner graph. Depending on, e.g., the size of the quasi-cyclic symmetry and the base graph/matrix, either of these techniques may be used for constructing superior LDPC codes.

The examples described herein may be summarized as follows:

Example 1 is a method for generating an optimized Low-Density Parity-Check, LDPC, code for an asymmetric transmission channel, the method comprising: receiving an initial LDPC code for the asymmetric transmission channel; and performing a density evolution threshold optimization for the initial LDPC code in order to obtain the optimized LDPC code for the asymmetric transmission channel, wherein a uniformly mixed symmetric channel density for the asymmetric transmission channel is used in the density evolution threshold optimization.

Example 2 is the method of example 1, wherein the uniformly mixed symmetric channel density is a combination of uniformly weighted channel densities for the asymmetric transmission channel for each possible input value of the asymmetric transmission channel.

Example 3 is the method of example 2, wherein the number of possible input values is two, wherein the uniformly mixed symmetric channel density is a sum of a channel density of the asymmetric transmission channel for one of the two possible input values and a channel density of the asymmetric transmission channel for the other of the two possible input values, and wherein the channel densities of the asymmetric transmission channel for the two possible input values are both weighted with a weighting factor of 0.5 in the uniformly mixed symmetric channel density of the asymmetric transmission channel.

Example 4 is the method of example 3, wherein the uniformly mixed symmetric channel density c(x) is given by an expression which is mathematically correspondent to $$c(x) = \tfrac{1}{2} \cdot c_0(x) + \tfrac{1}{2} \cdot c_1(-x)$$

with x denoting a value input to the asymmetric transmission channel, with $c_0(x)$ denoting the channel density of the asymmetric transmission channel for one of the two possible input values and $c_1(-x)$ denoting the channel density of the asymmetric transmission channel for the other of the two possible input values.

Example 5 is the method of any of examples 2 to 4, wherein, for each possible input value of the asymmetric transmission channel, the respective channel density of the asymmetric transmission channel is based on a respective error transition probability of the asymmetric transmission channel for the respective possible input value.

Example 6 is the method of example 5, wherein the number of possible input values is two, and wherein a channel density $c_0$ of the asymmetric transmission channel for one of the two possible input values is given by an expression which is mathematically correspondent to $$c_0(x; p) = p\Delta\left(x - \log\frac{p}{1-p}\right) + (1-p)\Delta\left(x - \log\frac{1-p}{p}\right)$$

with x denoting a value input to the asymmetric transmission channel and with p denoting the error transition probability of the asymmetric transmission channel for the one of the two possible input values.

Example 7 is the method of example 6, wherein a channel density $c_1$ of the asymmetric transmission channel for the other of the two possible input values is given by an expression which is mathematically correspondent to $$c_1(x; q) = (1-q)\Delta\left(x - \log\frac{q}{1-q}\right) + q\Delta\left(x - \log\frac{1-q}{q}\right)$$

with q denoting the error transition probability of the asymmetric transmission channel for the other of the two possible input values.

Example 8 is the method of any of examples 1 to 7, wherein performing the density evolution threshold optimization for the initial LDPC code comprises in a first iteration: modifying at least one of a column degree distribution and a row degree distribution of the initial LDPC code in order to obtain a modified LDPC code of the first iteration; determining a density evolution threshold for the modified LDPC code of the first iteration using the uniformly mixed symmetric channel density; and if the density evolution threshold for the modified LDPC code of the first iteration satisfies a quality criterion, selecting the modified LDPC code of the first iteration as the optimized LDPC code; else, selecting the initial LDPC code as the optimized LDPC code.

Example 9 is the method of example 8, wherein performing the density evolution threshold optimization for the initial LDPC code comprises in i-th iterations with 1<i: modifying at least one of the column degree distribution and the row degree distribution of the optimized LDPC code in order to obtain a modified LDPC code of the i-th iteration; determining the density evolution threshold for the modified LDPC code of the i-th iteration using the uniformly mixed symmetric channel density; and selecting the modified LDPC code of the i-th iteration as the optimized LDPC code if the density evolution threshold for the modified LDPC code of the i-th iteration satisfies the quality criterion.

Example 10 is a computer readable storage medium having stored thereon a program having a program code for performing the method of any of examples 1 to 9, when the program is executed on a processor or a programmable hardware component.

Example 11 is a computer program having a program code configured to perform the method of any of examples 1 to 9, when the program is executed on a processor or a programmable hardware component.

Example 12 is an apparatus for generating an optimized Low-Density Parity-Check, LDPC, code for an asymmetric transmission channel, the apparatus comprising: input circuitry configured to receive an initial LDPC code for the asymmetric transmission channel; and processing circuitry configured to perform a density evolution threshold optimization for the initial LDPC code in order to obtain the optimized LDPC code for the asymmetric transmission channel, wherein a uniformly mixed symmetric channel density for the asymmetric transmission channel is used in the density evolution threshold optimization.

Example 13 is the apparatus of example 12, wherein the uniformly mixed symmetric channel density is a combination of uniformly weighted channel densities of the asymmetric transmission channel for each possible input value of the asymmetric transmission channel.

Example 14 is the apparatus of example 13, wherein the number of possible input values is two, wherein the uniformly mixed symmetric channel density is a sum of a channel density of the asymmetric transmission channel for one of the two possible input values and a channel density of the asymmetric transmission channel for the other of the two possible input values, and wherein the channel densities of the asymmetric transmission channel for the two possible input values are both weighted with a weighting factor of 0.5 in the uniformly mixed symmetric channel density.

Example 15 is the apparatus of example 14, wherein the uniformly mixed symmetric channel density c(x) is given by an expression which is mathematically correspondent to $$c(x) = \tfrac{1}{2} \cdot c_0(x) + \tfrac{1}{2} \cdot c_1(-x)$$

with x denoting a value input to the asymmetric transmission channel, with $c_0(x)$ denoting the channel density of the asymmetric transmission channel for one of the two possible input values and $c_1(-x)$ denoting the channel density of the asymmetric transmission channel for the other of the two possible input values.

Example 16 is the apparatus of any of examples 13 to 15, wherein, for each possible input value of the asymmetric transmission channel, the respective channel density of the asymmetric transmission channel is based on a respective error transition probability of the asymmetric transmission channel for the respective possible input value.

Example 17 is the apparatus of example 16, wherein the number of possible input values is two, and wherein a channel density $c_0$ of the asymmetric transmission channel for one of the two possible input values is given by an expression which is mathematically correspondent to $$c_0(x; p) = p\Delta\left(x - \log\frac{p}{1-p}\right) + (1-p)\Delta\left(x - \log\frac{1-p}{p}\right)$$

with x denoting a value input to the asymmetric transmission channel and with p denoting the error transition probability of the asymmetric transmission channel for the one of the two possible input values.

Example 18 is the apparatus of example 17, wherein a channel density $c_1$ of the asymmetric transmission channel for the other of the two possible input values is given by an expression which is mathematically correspondent to $$c_1(x; q) = (1-q)\Delta\left(x - \log\frac{q}{1-q}\right) + q\Delta\left(x - \log\frac{1-q}{q}\right)$$

with q denoting the error transition probability of the asymmetric transmission channel for the other of the two possible input values.

Example 19 is the apparatus of any of examples 12 to 18, wherein, when performing the density evolution threshold optimization for the initial LDPC code, the processing circuitry is in a first iteration configured to: modify at least one of a column degree distribution and a row degree distribution of the initial LDPC code in order to obtain a modified LDPC code of the first iteration; determine a density evolution threshold for the modified LDPC code of the first iteration using the uniformly mixed symmetric channel density; and if the density evolution threshold for the modified LDPC code of the first iteration satisfies a quality criterion, select the modified LDPC code of the first iteration as the optimized LDPC code; else, select the initial LDPC code as the optimized LDPC code.

Example 20 is the apparatus of example 19, wherein, when performing the density evolution threshold optimization for the initial LDPC code, the processing circuitry is in i-th iterations with 1<i configured to: modify at least one of the column degree distribution and the row degree distribution of the optimized LDPC code in order to obtain a modified LDPC code of the i-th iteration; determine the density evolution threshold for the modified LDPC code of the i-th iteration using the uniformly mixed symmetric channel density; and select the modified LDPC code of the i-th iteration as the optimized LDPC code if the density evolution threshold for the modified LDPC code of the i-th iteration satisfies the quality criterion.

Example 21 is a method for generating an optimized Low-Density Parity-Check, LDPC, code which is optimized for a plurality of transmission channels, the method comprising: receiving an initial LDPC code; performing a density evolution threshold optimization for the initial LDPC code in order to obtain the optimized LDPC code, wherein at least one of a column degree distribution and a row degree distribution of the initial LDPC code is iteratively optimized in each iteration of the density evolution threshold optimization with respect to a plurality of density evolution thresholds for the plurality of transmission channels.

Example 22 is the method of example 21, wherein the initial LDPC code is initially set as the optimized LDPC code in the density evolution threshold optimization, and wherein performing the density evolution threshold optimization for the initial LDPC code comprises in i-th iterations with i≥1: modifying at least one of the column degree distribution and the row degree distribution of the optimized LDPC code in order to obtain a modified LDPC code of the i-th iteration; determining the respective density evolution threshold for the modified LDPC code of the i-th iteration for each of the plurality of transmission channels; and updating the current optimized LDPC code to the modified LDPC code of the i-th iteration if the density evolution thresholds for the modified LDPC code of the i-th iteration satisfy a quality criterion.

Example 23 is the method of example 22, wherein updating the optimized LDPC code to the modified LDPC code of the i-th iteration if the density evolution thresholds for the modified LDPC code of the i-th iteration satisfy the quality criterion comprises: determining a weighted sum of the determined density evolution thresholds for the modified LDPC code of the i-th iteration; and updating the current optimized LDPC code to the modified LDPC code of the i-th iteration if the weighted sum of the determined density evolution thresholds for the modified LDPC code of the i-th iteration is larger than a weighted sum of density evolution thresholds for the current optimized LDPC code.

Example 24 is the method of example 22, wherein updating the optimized LDPC code to the modified LDPC code of the i-th iteration if the density evolution thresholds for the modified LDPC code of the i-th iteration satisfy the quality criterion comprises: comparing the determined density evolution threshold for the modified LDPC code of the i-th iteration for one of the plurality of transmission channels to a density evolution threshold for the current optimized LDPC code for the one of the plurality of transmission channels; and updating the current optimized LDPC code to the modified LDPC code of the i-th iteration if: the determined density evolution threshold for the modified LDPC code of the i-th iteration for the one of the plurality of transmission channels is larger than the density evolution threshold for the current optimized LDPC code for the one of the plurality of transmission channels; and the determined density evolution thresholds for the modified LDPC code of the i-th iteration for the other ones of the plurality of transmission channels are above respective threshold values.

Example 25 is the method of any of examples 22 to 24, wherein performing the density evolution threshold optimization for the initial LDPC code further comprises in the i-th iterations: rejecting the modified LDPC code of the i-th iteration if the density evolution thresholds for the modified LDPC code of the i-th iteration do not satisfy the quality criterion.

Example 26 is a computer readable storage medium having stored thereon a program having a program code for performing the method of any of examples 21 to 25, when the program is executed on a processor or a programmable hardware component.

Example 27 is a computer program having a program code configured to perform the method of any of examples 21 to 25, when the program is executed on a processor or a programmable hardware component.

Example 28 is an apparatus for generating an optimized Low-Density Parity-Check, LDPC, code which is optimized for a plurality of transmission channels, the apparatus comprising: input circuitry configured to receive an initial LDPC code; and processing circuitry configured to perform a density evolution threshold optimization for the initial LDPC code in order to obtain the optimized LDPC code, wherein at least one of a column degree distribution and a row degree distribution of the initial LDPC code is iteratively optimized in each iteration of the density evolution threshold optimization with respect to a plurality of density evolution thresholds for the plurality of transmission channels.

Example 29 is the apparatus of example 28, wherein the initial LDPC code is initially set as the optimized LDPC code in the density evolution threshold optimization, and wherein, when performing the density evolution threshold optimization for the initial LDPC code, the processing circuitry is in i-th iterations with i≥1 configured to: modify at least one of the column degree distribution and the row degree distribution of the optimized LDPC code in order to obtain a modified LDPC code of the i-th iteration; determine the respective density evolution threshold for the modified LDPC code of the i-th iteration for each of the plurality of transmission channels; and update the current optimized LDPC code to the modified LDPC code of the i-th iteration if the density evolution thresholds for the modified LDPC code of the i-th iteration satisfy a quality criterion.

Example 30 is the apparatus of example 29, wherein, when updating the optimized LDPC code to the modified LDPC code of the i-th iteration if the density evolution thresholds for the modified LDPC code of the i-th iteration satisfy the quality criterion, the processing circuitry is configured to: determine a weighted sum of the determined density evolution thresholds for the modified LDPC code of the i-th iteration; and update the current optimized LDPC code to the modified LDPC code of the i-th iteration if the weighted sum of the determined density evolution thresholds for the modified LDPC code of the i-th iteration is larger than a weighted sum of density evolution thresholds for the current optimized LDPC code.

Example 31 is the apparatus of example 29, wherein, when updating the optimized LDPC code to the modified LDPC code of the i-th iteration if the density evolution thresholds for the modified LDPC code of the i-th iteration satisfy the quality criterion, the processing circuitry is configured to: compare the determined density evolution threshold for the modified LDPC code of the i-th iteration for one of the plurality of transmission channels to a density evolution threshold for the current optimized LDPC code for the one of the plurality of transmission channels; and update the current optimized LDPC code to the modified LDPC code of the i-th iteration if: the determined density evolution threshold for the modified LDPC code of the i-th iteration for the one of the plurality of transmission channels is larger than the density evolution threshold for the current optimized LDPC code for the one of the plurality of transmission channels; and the determined density evolution thresholds for the modified LDPC code of the i-th iteration for the other ones of the plurality of transmission channels are above respective threshold values.

Example 32 is the apparatus of any of examples 29 to 31, wherein, when performing the density evolution threshold optimization for the initial LDPC code, the processing circuitry is in the i-th iterations further configured to: reject the modified LDPC code of the i-th iteration if the density evolution thresholds for the modified LDPC code of the i-th iteration do not satisfy the quality criterion.

Example 33 is a method for optimizing a Low-Density Parity-Check, LDPC, code, wherein a parity-check matrix of the LDPC code is formed of a plurality of sub-matrices, wherein the sub-matrices are circulant permutation matrices represented by a respective exponent, and wherein the respective exponent indicates either a respective circular shift of the respective sub-matrix with respect to an identity matrix or that the respective sub-matrix is equal to a zero matrix, the method comprising: providing an exponent matrix of the LDPC code, wherein each entry in the exponent matrix is assigned to a respective one of the plurality of sub-matrices and indicates a value of the respective exponent; and iteratively perturbing the exponent matrix of the LDPC code in order to increase a girth of the LDPC code.

Example 34 is the method of example 33, wherein the sub-matrices are of size Q×Q, and wherein iteratively perturbing the exponent matrix of the LDPC code comprises in at least one iteration: determining, for each exponent in the exponent matrix of the LDPC code that indicates a respective circular shift of the respective sub-matrix with respect to the identity matrix, a number of cycles of length n in a Tanner graph representation of the LDPC code in which a node in the Tanner graph representation of the LDPC code that is represented by the sub-matrix assigned to the respective exponent occurs; randomly selecting an exponent among those exponents in the exponent matrix of the LDPC code exhibiting the a % highest numbers of cycles of length n; determining, for each value within a value range from 0 and Q−1 under the assumption that the current value of the randomly selected exponent is changed to the respective value within the value range, a respective hypothetic number of cycles of length n in which a node in the Tanner graph representation of the LDPC code that is represented by the sub-matrix assigned to the randomly selected exponent occurs; and updating the current value of the randomly selected exponent to a value among those values within the value range causing the i % lowest numbers of cycles of length n.

Example 35 is the method of example 34, wherein the current value of the randomly selected exponent is updated to the value within the value range causing the lowest numbers of cycles of length n.

Example 36 is the method of example 34, wherein the current value of the randomly selected exponent is updated to a randomly selected value among those values within the value range causing the i % lowest numbers of cycles of length n.

Example 37 is the method of any of examples 34 to 36, wherein iteratively perturbing the exponent matrix of the LDPC code comprises in at least one further iteration: determining, for each exponent in the exponent matrix of the LDPC code that indicates a respective circular shift of the respective sub-matrix with respect to the identity matrix, a number of cycles of length m in the Tanner graph representation of the LDPC code in which a node in the Tanner graph representation of the LDPC code that is represented by the sub-matrix assigned to the respective exponent occurs, wherein n<m; randomly selecting an exponent among those exponents in the exponent matrix of the LDPC code exhibiting the b % highest numbers of cycles of length m; determining, for each value within a value range from 0 and Q−1 under the assumption that the current value of the randomly selected exponent is changed to the respective value within the value range, a respective hypothetic number of cycles of length m in which a node in the Tanner graph representation of the LDPC code that is represented by the sub-matrix assigned to the randomly selected exponent occurs; and updating the current value of the randomly selected exponent to a value among those values within the value range causing the j % lowest numbers of cycles of length m.

Example 38 is the method of example 33, wherein the sub-matrices are of size Q×Q, wherein each entry in a base matrix of the LDPC code is assigned to a respective one of the plurality of sub-matrices and indicates whether the respective sub-matrix is equal to the zero matrix or a circularly shifted replica of the identity matrix, and wherein iteratively perturbing the exponent matrix of the LDPC code comprises in at least one iteration: determining, for each column in the exponent matrix of the LDPC code, a number of cycles of length n in a Tanner graph representation of the LDPC code in which a node in the Tanner graph representation of the LDPC code that is represented by sub-matrices assigned to the respective column occurs; randomly selecting a column among those columns in the exponent matrix of the LDPC code exhibiting the a % highest numbers of cycles of length n; permuting entries in the base matrix of the LDPC code that correspond to the randomly selected column; randomly setting a total of g entries among those entries in the base matrix of the LDPC code that correspond to the randomly selected column to indicate that the respectively assigned sub-matrix is a circularly shifted replica of the identity matrix, wherein g is a predetermined column degree of the randomly selected column; performing the following for each randomly set entry in the base matrix: determining, for each value within a value range from 0 and Q−1 under the assumption that a current value of a respective exponent in the randomly selected column is changed to the respective value within the value range, a respective hypothetic number of cycles of length n in a Tanner graph representation of the LDPC code in which a node in the Tanner graph representation of the LDPC code that is represented by the sub-matrix assigned to the respective exponent in the randomly selected column occurs, wherein the respective exponent in the randomly selected column corresponds to the respective randomly set entry in the base matrix; and updating the current value of the respective exponent in the randomly selected column to a value among those values within the value range causing the i % lowest numbers of cycles of length n for the respective exponent in the randomly selected column; and accepting the changes to the entries of the base matrix and the exponent matrix for the randomly selected column only if the changes do not increase a total number of cycles of length n for the randomly selected column.

Example 39 is the method of example 38, wherein the current value of the respective exponent in the randomly selected column is updated to the value within the value range causing the lowest numbers of cycles of length n for the respective exponent.

Example 40 is the method of example 38, wherein the current value of the respective exponent in the randomly selected column is updated to a randomly selected value among those values within the value range causing the i % lowest numbers of cycles of length n for the respective exponent.

Example 41 is the method of any of examples 38 to 40, wherein iteratively perturbing the exponent matrix of the LDPC code comprises in at least one further iteration: determining, for each column in the exponent matrix of the LDPC code, a number of cycles of length m in the Tanner graph representation of the LDPC code in which a node in the Tanner graph representation of the LDPC code that is represented by sub-matrices assigned to the respective column occurs, wherein n<m; randomly selecting a column among those columns in the exponent matrix of the LDPC code exhibiting the b % highest numbers of cycles of length m; permuting entries in the base matrix of the LDPC code that correspond to the randomly selected column; randomly setting a total of h entries among those entries in the base matrix of the LDPC code that correspond to the randomly selected column to indicate that the respectively assigned sub-matrix is a circularly shifted replica of the identity matrix, wherein h is a predetermined column degree of the randomly selected column; performing the following for each randomly set entry in the base matrix: determining, for each value within the value range from 0 and Q−1 under the assumption that the current value of a respective exponent in the randomly selected column is changed to the respective value within the value range, a respective hypothetic number of cycles of length m in the Tanner graph representation of the LDPC code in which a node in the Tanner graph representation of the LDPC code that is represented by the sub-matrix assigned to the respective exponent in the randomly selected column occurs, wherein the respective exponent in the randomly selected column corresponds to the respective randomly set entry in the base matrix; and updating the current value of the respective exponent in the randomly selected column to a value among those values within the value range causing the j % lowest numbers of cycles of length m for the respective exponent in the randomly selected column; and accepting the changes to the entries of the base matrix and the exponent matrix for the randomly selected column only if the changes do not increase a total number of cycles of length m for the randomly selected column.

Example 42 is the method of any of examples 33 to 41, wherein the exponent matrix of the LDPC code is provided such that a girth of the LDPC code is larger than four.

Example 43 is the method of any of examples 33 to 42, wherein the sub-matrices are of size Q×Q, and wherein providing the exponent matrix of the LDPC code comprises: generating a base matrix of the LDPC code based on a predetermined column degree and row degree distribution for the LDPC code, wherein each entry in the base matrix is assigned to a respective one of the plurality of sub-matrices and indicates whether the respective sub-matrix is equal to the zero matrix or a circularly shifted replica of the identity matrix; and generating the exponent matrix of the LDPC code by randomly assigning a value between 0 and Q−1 to the respective exponent of each of the plurality of sub-matrices for which the base matrix of the LDPC code indicates that the sub-matrix is a circularly shifted replica of the identity matrix until a girth of the LDPC code is larger than four.

Example 44 is the method of any of examples 33 to 42, wherein providing the exponent matrix of the LDPC code comprises: generating the exponent matrix of the LDPC code and a base matrix of the LDPC code by progressive edge growth based on a predetermined column degree and row degree distribution for the LDPC code until a girth of the LDPC code is larger than four, wherein each entry in the base matrix is assigned to a respective one of the plurality of sub-matrices and indicates whether the respective sub-matrix is equal to the zero matrix or a circularly shifted replica of the identity matrix.

Example 45 is the method of any of examples 33 to 44, wherein the LDPC code is a quasi-cyclic LDPC code.

Example 46 is the method of any of examples 33 to 45, wherein iteratively perturbing the exponent matrix of the LDPC code in order to increase the girth of the LDPC code comprises in the following order: iteratively perturbing the exponent matrix of the LDPC code in order to minimize cycles of length n in a Tanner graph representation of the LDPC code; and iteratively perturbing the exponent matrix of the LDPC code in order to minimize cycles of length m in the Tanner graph representation of the LDPC code, wherein n<m.

Example 47 is the method of any of examples 33 to 46, wherein, if a minimum column degree of the provided LDPC code is four or more, iteratively perturbing the exponent matrix of the LDPC code in order to increase the girth of the LDPC code comprises in the following order: iteratively perturbing the exponent matrix of the LDPC code in order to remove all cycles of length 4 in a Tanner graph representation of the LDPC code; iteratively perturbing the exponent matrix of the LDPC code in order to minimize cycles of length 6 in the Tanner graph representation of the LDPC code; iteratively perturbing the exponent matrix of the LDPC code in order to minimize cycles of length 8 in the Tanner graph representation of the LDPC code; and iteratively perturbing the exponent matrix of the LDPC code in order to minimize cycles of length 10 in the Tanner graph representation of the LDPC code.

Example 48 is the method of any of examples 33 to 46, wherein, if a minimum column degree of the provided LDPC code is three, iteratively perturbing the exponent matrix of the LDPC code in order to increase the girth of the LDPC code comprises in the following order: iteratively perturbing the exponent matrix of the LDPC code in order to remove all cycles of length 4 in a Tanner graph representation of the LDPC code in which a node in the Tanner graph representation of the LDPC code that is represented by a sub-matrix assigned to any column of the exponent matrix with a column degree of four or more occurs; iteratively perturbing the exponent matrix of the LDPC code in order to remove all cycles of length 6 in the Tanner graph representation of the LDPC code in which a node in the Tanner graph representation of the LDPC code that is represented by a sub-matrix assigned to any column of the exponent matrix with a column degree of three occurs; iteratively perturbing the exponent matrix of the LDPC code in order to minimize cycles of length 8 in the Tanner graph representation of the LDPC code in which a node in the Tanner graph representation of the LDPC code that is represented by a sub-matrix assigned to any column of the exponent matrix with a column degree of three occurs; and iteratively perturbing the exponent matrix of the LDPC code in order to minimize cycles of length 10 in the Tanner graph representation of the LDPC code in which a node in the Tanner graph representation of the LDPC code that is represented by a sub-matrix assigned to any column of the exponent matrix with a column degree of three occurs.

Example 49 is the method of any of examples 33 to 46, wherein, if a minimum column degree of the provided LDPC code is two, iteratively perturbing the exponent matrix of the LDPC code in order to increase the girth of the LDPC code comprises in the following order: iteratively perturbing the exponent matrix of the LDPC code in order to remove all cycles of length 4 in a Tanner graph representation of the LDPC code in which a node in the Tanner graph representation of the LDPC code that is represented by a sub-matrix assigned to any column of the exponent matrix with a column degree of four or more occurs; iteratively perturbing the exponent matrix of the LDPC code in order to remove all cycles of length 6 in the Tanner graph representation of the LDPC code in which a node in the Tanner graph representation of the LDPC code that is represented by a sub-matrix assigned to any column of the exponent matrix with a column degree of two or three occurs; iteratively perturbing the exponent matrix of the LDPC code in order to remove all cycles of length 6 in the Tanner graph representation of the LDPC code in which a node in the Tanner graph representation of the LDPC code that is represented by a sub-matrix assigned to any column of the exponent matrix with a column degree of three occurs; iteratively perturbing the exponent matrix of the LDPC code in order to minimize cycles of length 6 in the Tanner graph representation of the LDPC code in which a node in the Tanner graph representation of the LDPC code that is represented by a sub-matrix assigned to any column of the exponent matrix with a column degree of two or more occurs; iteratively perturbing the exponent matrix of the LDPC code in order to remove all cycles of length 8 in the Tanner graph representation of the LDPC code in which a node in the Tanner graph representation of the LDPC code that is represented by a sub-matrix assigned to any column of the exponent matrix with a column degree of two or three occurs; iteratively perturbing the exponent matrix of the LDPC code in order to minimize cycles of length 8 in the Tanner graph representation of the LDPC code in which a node in the Tanner graph representation of the LDPC code that is represented by a sub-matrix assigned to any column of the exponent matrix with a column degree of three occurs; iteratively perturbing the exponent matrix of the LDPC code in order to minimize cycles of length 10 in the Tanner graph representation of the LDPC code in which a node in the Tanner graph representation of the LDPC code that is represented by a sub-matrix assigned to any column of the exponent matrix with a column degree of two or three occurs; and iteratively perturbing the exponent matrix of the LDPC code in order to minimize cycles of length 8 in the Tanner graph representation of the LDPC code in which a node in the Tanner graph representation of the LDPC code that is represented by a sub-matrix assigned to any column of the exponent matrix with a column degree of two or more occurs.

Example 50 is a computer readable storage medium having stored thereon a program having a program code for performing the method of any of examples 33 to 49, when the program is executed on a processor or a programmable hardware component.

Example 51 is a computer program having a program code configured to perform the method of any of examples 33 to 49, when the program is executed on a processor or a programmable hardware component.

Example 52 is an apparatus for optimizing a Low-Density Parity-Check, LDPC, code, wherein a parity-check matrix of the LDPC code is formed of a plurality of sub-matrices, wherein the sub-matrices are circulant permutation matrices represented by a respective exponent, and wherein the respective exponent indicates a respective circular shift of the respective sub-matrix with respect to an identity matrix or that the respective sub-matrix is equal to a zero matrix, the apparatus comprising processing circuitry configured to: provide an exponent matrix of the LDPC code, wherein each entry in the exponent matrix is assigned to a respective one of the plurality of sub-matrices and indicates a value of the respective exponent; and iteratively perturb the exponent matrix of the LDPC code in order to increase a girth of the LDPC code.

Example 53 is the apparatus of example 52, wherein the sub-matrices are of size Q×Q, and wherein, when iteratively perturbing the exponent matrix of the LDPC code, the processing circuitry is in at least one iteration configured to: determine, for each exponent in the exponent matrix of the LDPC code that indicates a respective circular shift of the respective sub-matrix with respect to the identity matrix, a number of cycles of length n in a Tanner graph representation of the LDPC code in which a node in the Tanner graph representation of the LDPC code that is represented by the sub-matrix assigned to the respective exponent occurs; randomly select an exponent among those exponents in the exponent matrix of the LDPC code exhibiting the a % highest numbers of cycles of length n; determine, for each value within a value range from 0 and Q−1 under the assumption that the current value of the randomly selected exponent is changed to the respective value within the value range, a respective hypothetic number of cycles of length n in which a node in the Tanner graph representation of the LDPC code that is represented by the sub-matrix assigned to the randomly selected exponent occurs; and update the current value of the randomly selected exponent to a value among those values within the value range causing the i % lowest numbers of cycles of length n.

Example 54 is the apparatus of example 52, wherein the sub-matrices are of size Q×Q, wherein each entry in a base matrix of the LDPC code is assigned to a respective one of the plurality of sub-matrices and indicates whether the respective sub-matrix is equal to the zero matrix or a circularly shifted replica of the identity matrix, and wherein, when iteratively perturbing the exponent matrix of the LDPC code, the processing circuitry is in at least one iteration configured to: determine, for each column in the exponent matrix of the LDPC code, a number of cycles of length n in a Tanner graph representation of the LDPC code in which a node in the Tanner graph representation of the LDPC code that is represented by sub-matrices assigned to the respective column occurs; randomly select a column among those columns in the exponent matrix of the LDPC code exhibiting the a % highest numbers of cycles of length n; permute entries in the base matrix of the LDPC code that correspond to the randomly selected column; randomly set a total of g entries among those entries in the base matrix of the LDPC code that correspond to the randomly selected column to indicate that the respectively assigned sub-matrix is a circularly shifted replica of the identity matrix, wherein g is a predetermined column degree of the randomly selected column; perform the following for each randomly set entry in the base matrix: determine, for each value within a value range from 0 and Q−1 under the assumption that a current value of a respective exponent in the randomly selected column is changed to the respective value within the value range, a respective hypothetic number of cycles of length n in a Tanner graph representation of the LDPC code in which a node in the Tanner graph representation of the LDPC code that is represented by the sub-matrix assigned to the respective exponent in the randomly selected column occurs, wherein the respective exponent in the randomly selected column corresponds to the respective randomly set entry in the base matrix; and update the current value of the respective exponent in the randomly selected column to a value among those values within the value range causing the i % lowest numbers of cycles of length n for the respective exponent in the randomly selected column; and accept the changes to the entries of the base matrix and the exponent matrix for the randomly selected column only if the changes do not increase a total number of cycles of length n for the randomly selected column.

Example 55 is the apparatus of any of examples 52 to 54, wherein the processing circuitry is configured to provide the exponent matrix of the LDPC code such that a girth of the LDPC code is larger than four.

Example 56 is the apparatus of any of examples 52 to 55, wherein the sub-matrices are of size Q×Q, and wherein, when providing the exponent matrix of the LDPC code, the processing circuitry is configured to: generate a base matrix of the LDPC code based on a predetermined column degree and row degree distribution for the LDPC code, wherein each entry in the base matrix is assigned to a respective one of the plurality of sub-matrices and indicates whether the respective sub-matrix is equal to the zero matrix or a circularly shifted replica of the identity matrix; and generate the exponent matrix of the LDPC code by randomly assigning a value between 0 and Q−1 to the respective exponent of each of the plurality of sub-matrices for which the base matrix of the LDPC code indicates that the sub-matrix is a circularly shifted replica of the identity matrix until a girth of the LDPC code is larger than four.

Example 57 is the apparatus of any of examples 52 to 55, wherein, when providing the exponent matrix of the LDPC code, the processing circuitry is configured to: generate the exponent matrix of the LDPC code and a base matrix of the LDPC code by progressive edge growth based on a predetermined column degree and row degree distribution for the LDPC code until a girth of the LDPC code is larger than four, wherein each entry in the base matrix is assigned to a respective one of the plurality of sub-matrices and indicates whether the respective sub-matrix is equal to the zero matrix or a circularly shifted replica of the identity matrix.

The aspects and features described in relation to a particular one of the previous examples may also be combined with one or more of the further examples to replace an identical or similar feature of that further example or to additionally introduce the features into the further example.

Examples may further be or relate to a (computer) program including a program code to execute one or more of the above methods when the program is executed on a computer, processor or other programmable hardware component. Thus, steps, operations or processes of different ones of the methods described above may also be executed by programmed computers, processors or other programmable hardware components. Examples may also cover program storage devices, such as digital data storage media, which are machine-, processor- or computer-readable and encode and/or contain machine-executable, processor-executable or computer-executable programs and instructions. Program storage devices may include or be digital storage devices, magnetic storage media such as magnetic disks and magnetic tapes, hard disk drives, or optically readable digital data storage media, for example. Other examples may also include computers, processors, control units, (field) programmable logic arrays ((F)PLAs), (field) programmable gate arrays ((F)PGAs), graphics processor units (GPU), ASICs, integrated circuits (ICs) or system-on-a-chip (SoCs) systems programmed to execute the steps of the methods described above.

It is further understood that the disclosure of several steps, processes, operations or functions disclosed in the description or claims shall not be construed to imply that these operations are necessarily dependent on the order described, unless explicitly stated in the individual case or necessary for technical reasons. Therefore, the previous description does not limit the execution of several steps or functions to a certain order. Furthermore, in further examples, a single step, function, process or operation may include and/or be broken up into several sub-steps, -functions, -processes or -operations.

If some aspects have been described in relation to a device or system, these aspects should also be understood as a description of the corresponding method. For example, a block, device or functional aspect of the device or system may correspond to a feature, such as a method step, of the corresponding method. Accordingly, aspects described in relation to a method shall also be understood as a description of a corresponding block, a corresponding element, a property or a functional feature of a corresponding device or a corresponding system.

The following claims are hereby incorporated in the detailed description, wherein each claim may stand on its own as a separate example. It should also be noted that although in the claims a dependent claim refers to a particular combination with one or more other claims, other examples may also include a combination of the dependent claim with the subject matter of any other dependent or independent claim. Such combinations are hereby explicitly proposed, unless it is stated in the individual case that a particular combination is not intended. Furthermore, features of a claim should also be included for any other independent claim, even if that claim is not directly defined as dependent on that other independent claim.

What is claimed is:

1. A method for generating an optimized Low-Density Parity-Check, LDPC, code for an asymmetric transmission channel, the method comprising:
   receiving an initial LDPC code for the asymmetric transmission channel;
   performing a density evolution threshold optimization for the initial LDPC code in order to generate the optimized LDPC code for the asymmetric transmission channel;
   encoding data using the optimized LDPC code; and
   transmitting a signal comprising the encoded data over the asymmetric transmission channel,
   wherein a uniformly mixed symmetric channel density for the asymmetric transmission channel is used in the density evolution threshold optimization,
   wherein the density evolution threshold optimization is performed in one or more iterations,
   wherein in each iteration, the density evolution threshold optimization is performed by:
     modifying at least one of a column degree distribution or a row degree distribution of the initial LDPC code or an LDPC code selected as the optimized LDPC code in a previous iteration to obtain a modified LDPC code;
     determining a density evolution threshold for the modified LDPC code using the uniformly mixed symmetric channel density; and
     selecting the modified LDPC code as the optimized LDPC code if the density evolution threshold for the modified LDPC code satisfies a quality criterion.

2. The method of claim 1, wherein the uniformly mixed symmetric channel density is a combination of uniformly weighted channel densities for the asymmetric transmission channel for each possible input value of the asymmetric transmission channel.

3. The method of claim 2, wherein the number of possible input values is two, wherein the uniformly mixed symmetric channel density is a sum of a channel density of the asymmetric transmission channel for one of the two possible input values and a channel density of the asymmetric transmission channel for the other of the two possible input values, and wherein the channel densities of the asymmetric transmission channel for the two possible input values are both weighted with a weighting factor of 0.5 in the uniformly mixed symmetric channel density of the asymmetric transmission channel.

4. The method of claim 3, wherein the uniformly mixed symmetric channel density c(x) is given by an expression which is mathematically correspondent to $$c(x) = \frac{1}{2} \cdot c_0(x) + \frac{1}{2} \cdot c_1(-x)$$

with x denoting a value input to the asymmetric transmission channel, with $c_0(x)$ denoting the channel density of the asymmetric transmission channel for one of the two possible input values and $c_1(-x)$ denoting the channel density of the asymmetric transmission channel for the other of the two possible input values.

5. The method of claim 2, wherein, for each possible input value of the asymmetric transmission channel, the respective channel density of the asymmetric transmission channel is based on a respective error transition probability of the asymmetric transmission channel for the respective possible input value.

6. The method of claim 5, wherein the number of possible input values is two, and wherein a channel density $c_0$ of the asymmetric transmission channel for one of the two possible input values is given by an expression which is mathematically correspondent to $$c_0(x; p) = p\Delta\left(x - \log\frac{p}{1-p}\right) + (1-p)\Delta\left(x - \log\frac{1-p}{p}\right)$$

with x denoting a value input to the asymmetric transmission channel and with p denoting the error transition probability of the asymmetric transmission channel for the one of the two possible input values.

7. The method of claim 6, wherein a channel density $c_1$ of the asymmetric transmission channel for the other of the two possible input values is given by an expression which is mathematically correspondent to $$c_1(x; q) = (1-q)\Delta\left(x - \log\frac{q}{1-q}\right) + q\Delta\left(x - \log\frac{1-q}{q}\right)$$

with q denoting the error transition probability of the asymmetric transmission channel for the other of the two possible input values.

8. The method of claim 1, wherein performing the density evolution threshold optimization for the initial LDPC code comprises in a first iteration:
modifying at least one of a column degree distribution and a row degree distribution of the initial LDPC code in order to obtain a modified LDPC code of the first iteration;
determining a density evolution threshold for the modified LDPC code of the first iteration using the uniformly mixed symmetric channel density; and
if the density evolution threshold for the modified LDPC code of the first iteration satisfies a quality criterion, selecting the modified LDPC code of the first iteration as the optimized LDPC code;
else, selecting the initial LDPC code as the optimized LDPC code.

9. The method of claim 8, wherein performing the density evolution threshold optimization for the initial LDPC code comprises in i-th iterations with 1<i:
modifying at least one of the column degree distribution and the row degree distribution of the optimized LDPC code in order to obtain a modified LDPC code of the i-th iteration;
determining the density evolution threshold for the modified LDPC code of the i-th iteration using the uniformly mixed symmetric channel density; and
selecting the modified LDPC code of the i-th iteration as the optimized LDPC code if the density evolution threshold for the modified LDPC code of the i-th iteration satisfies the quality criterion.

10. A computer readable storage medium having stored thereon a program having a program code for performing the method of claim 1, when the program is executed on a processor or a programmable hardware component.

11. An apparatus for generating an optimized Low-Density Parity-Check, LDPC, code for an asymmetric transmission channel, the apparatus comprising:
input circuitry configured to receive an initial LDPC code for the asymmetric transmission channel; and
processing circuitry configured to perform a density evolution threshold optimization for the initial LDPC code in order to generate the optimized LDPC code for the asymmetric transmission channel, encode data using the optimized LDPC code, and transmit a signal comprising the encoded data over the asymmetric transmission channel,
wherein a uniformly mixed symmetric channel density for the asymmetric transmission channel is used in the density evolution threshold optimization,
wherein the processing circuitry is configured to perform the density evolution threshold optimization in one or more iterations,
wherein, in each iteration, the processing circuitry is configured to:
modify at least one of a column degree distribution or a row degree distribution of the initial LDPC code or an LDPC code selected as the optimized LDPC code in a previous iteration to obtain a modified LDPC code;
determine a density evolution threshold for the modified LDPC code using the uniformly mixed symmetric channel density; and
select the modified LDPC code as the optimized LDPC code if the density evolution threshold for the modified LDPC code satisfies a quality criterion.

12. The apparatus of claim 11, wherein the uniformly mixed symmetric channel density is a combination of uniformly weighted channel densities of the asymmetric transmission channel for each possible input value of the asymmetric transmission channel.

13. The apparatus of claim 12, wherein the number of possible input values is two, wherein the uniformly mixed symmetric channel density is a sum of a channel density of the asymmetric transmission channel for one of the two possible input values and a channel density of the asymmetric transmission channel for the other of the two possible input values, and wherein the channel densities of the asymmetric transmission channel for the two possible input values are both weighted with a weighting factor of 0.5 in the uniformly mixed symmetric channel density.

14. The apparatus of claim 13, wherein the uniformly mixed symmetric channel density c(x) is given by an expression which is mathematically correspondent to $$c(x) = \frac{1}{2} \cdot c_0(x) + \frac{1}{2} \cdot c_1(-x)$$

with x denoting a value input to the asymmetric transmission channel, with $c_0(x)$ denoting the channel density of the asymmetric transmission channel for one of the two possible input values and $c_1(-x)$ denoting the channel density of the asymmetric transmission channel for the other of the two possible input values.

15. The apparatus of claim 12, wherein, for each possible input value of the asymmetric transmission channel, the respective channel density of the asymmetric transmission channel is based on a respective error transition probability of the asymmetric transmission channel for the respective possible input value.

16. The apparatus of claim 15, wherein the number of possible input values is two, and wherein a channel density $C_0$ of the asymmetric transmission channel for one of the two possible input values is given by an expression which is mathematically correspondent to $$c_0(x; p) = p\Delta\left(x - \log\frac{p}{1-p}\right) + (1-p)\Delta\left(x - \log\frac{1-p}{p}\right)$$

with x denoting a value input to the asymmetric transmission channel and with p denoting the error transition probability of the asymmetric transmission channel for the one of the two possible input values.

17. The apparatus of claim 16, wherein a channel density $c_1$ of the asymmetric transmission channel for the other of the two possible input values is given by an expression which is mathematically correspondent to $$c_1(x; q) = (1-q)\Delta\left(x - \log\frac{q}{1-q}\right) + q\Delta\left(x - \log\frac{1-q}{q}\right)$$

with q denoting the error transition probability of the asymmetric transmission channel for the other of the two possible input values.

18. The apparatus of claim 11, wherein, when performing the density evolution threshold optimization for the initial LDPC code, the processing circuitry is in a first iteration configured to:
  modify at least one of a column degree distribution and a row degree distribution of the initial LDPC code in order to obtain a modified LDPC code of the first iteration;
  determine a density evolution threshold for the modified LDPC code of the first iteration using the uniformly mixed symmetric channel density; and
  if the density evolution threshold for the modified LDPC code of the first iteration satisfies a quality criterion, select the modified LDPC code of the first iteration as the optimized LDPC code;
  else, select the initial LDPC code as the optimized LDPC code.

19. The apparatus of claim 18, wherein, when performing the density evolution threshold optimization for the initial LDPC code, the processing circuitry is in i-th iterations with 1<i configured to:
  modify at least one of the column degree distribution and the row degree distribution of the optimized LDPC code in order to obtain a modified LDPC code of the i-th iteration;
  determine the density evolution threshold for the modified LDPC code of the i-th iteration using the uniformly mixed symmetric channel density; and
  select the modified LDPC code of the i-th iteration as the optimized LDPC code if the density evolution threshold for the modified LDPC code of the i-th iteration satisfies the quality criterion.

* * * * *